United States Patent
Iba

(10) Patent No.: US 8,026,112 B2
(45) Date of Patent: Sep. 27, 2011

(54) METHOD OF MANUFACTURING SEMICONDUCTOR DEVICE

(75) Inventor: Yoshihisa Iba, Yokohama (JP)

(73) Assignee: Fujitsu Semiconductor Limited, Yokohama (JP)

( * ) Notice: Subject to any disclaimer, the term of this patent is extended or adjusted under 35 U.S.C. 154(b) by 0 days.

(21) Appl. No.: 12/971,079

(22) Filed: Dec. 17, 2010

(65) Prior Publication Data

US 2011/0159609 A1 Jun. 30, 2011

(30) Foreign Application Priority Data

Dec. 25, 2009 (JP) ................. 2009-296224

(51) Int. Cl.
*H01L 21/00* (2006.01)

(52) U.S. Cl. ..... 438/3; 438/257; 438/433; 438/E21.108; 257/295

(58) Field of Classification Search ...... 438/3, 433–437, 438/257–258; 257/295, 510
See application file for complete search history.

(56) References Cited

U.S. PATENT DOCUMENTS

| | | | |
|---|---|---|---|
| 2003/0073253 A1* | 4/2003 | Okazawa et al. | 438/3 |
| 2005/0277207 A1* | 12/2005 | Costrini et al. | 438/3 |
| 2006/0220084 A1 | 10/2006 | Umehara et al. | |
| 2009/0039451 A1 | 2/2009 | Ueno et al. | |

FOREIGN PATENT DOCUMENTS

| | | |
|---|---|---|
| JP | 2006-005152 A | 1/2006 |
| JP | 2006-253303 A | 9/2006 |
| JP | 2006-261592 A | 9/2006 |
| JP | 2008-135619 A | 6/2008 |
| JP | 2009-016417 A | 1/2009 |
| JP | 2009-043831 A | 2/2009 |

* cited by examiner

*Primary Examiner* — Dung A. Le

(74) *Attorney, Agent, or Firm* — Westerman, Hattori, Daniels & Adrian, LLP

(57) ABSTRACT

A method of manufacturing a semiconductor device includes: forming first conductive layer on semiconductor substrate; forming a magnetic film on the first conductive layer; forming second conductive layer on the magnetic film; forming a first mask layer on the second conductive layer; patterning the second conductive layer; patterning the magnetic film; forming a first insulating film on the first conductive layer to cover side surfaces of the patterned second conductive layer and the patterned magnetic film; forming a second mask layer on the first insulating film to cover the patterned second conductive layer, the patterned magnetic film, and the first insulating film; patterning the first insulating film; patterning the first conductive layer; forming a second insulating film on the semiconductor substrate to cover the patterned second conductive layer, the patterned magnetic film, and the patterned first conductive layer; and forming a third insulating film on the second insulating film.

14 Claims, 19 Drawing Sheets

US 8,026,112 B2

METHOD OF MANUFACTURING SEMICONDUCTOR DEVICE

CROSS-REFERENCE TO RELATED APPLICATIONS

This application claims the benefit of priority from Japanese Patent Application No. 2009-296224 filed on Dec. 25, 2009, the entire contents of which are incorporated herein by reference.

BACKGROUND

1. Field

The embodiments discussed herein relate to a method of manufacturing a semiconductor device having magnetic elements.

2. Description of Related Art

In a magnetotunnel junction (MTJ) including two ferromagnetic layers having a thin insulating layer therebetween, the tunnel resistance varies depending on the relative directions of magnetization of the two ferromagnetic layers. A magneto-resistive random access memory (MRAM) may be a semiconductor device where magnetic elements (MTJ elements) having MTJs utilizing a tunnel magneto resistance (TMR) effect are arranged in a matrix form as a memory cell.

Related art is disclosed in, for example, Japanese Laid-open Patent Publication Nos. 2006-253303, 2009-43831, 2006-261592, 2009-16417, 2008-135619, and 2006-5152.

SUMMARY

One aspect of the embodiments is a method of manufacturing a semiconductor device including: forming a first conductive layer on a semiconductor substrate; forming a magnetic film on the first conductive layer; forming a second conductive layer on the magnetic film; forming a first mask layer on the second conductive layer; patterning the second conductive layer; patterning the magnetic film; forming a first insulating film on the first conductive layer to cover a side surface of the patterned second conductive layer and the patterned magnetic film; forming a second mask layer on the first insulating film to cover the patterned second conductive layer, the patterned magnetic film, and the first insulating film; patterning the first insulating film; patterning the first conductive layer; forming a second insulating film on the semiconductor substrate to cover the patterned second conductive layer, the patterned magnetic film, and the patterned first conductive layer; and forming a third insulating film on the second insulating film.

Additional advantages and novel features of the invention will be set forth in part in the description that follows, and in part will become more apparent to those skilled in the art upon examination of the following or upon learning by practice of the invention.

DESCRIPTION OF EMBODIMENTS

Figure 1A:
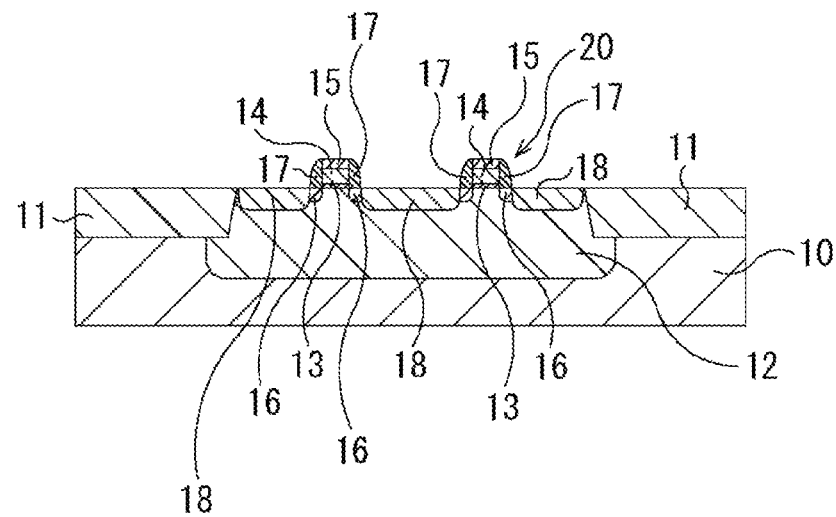
FIGS. 1A to 1C illustrate an exemplary method of manufacturing an MRAM.

The memory cell of an MRAM includes selection transistors, an MTJ element, upper and lower electrodes coupled so as to have the MTJ element therebetween, and a magnetic field-generating layer for magnetization reversal by generating a magnetic field in the MTJ element. A spin-injection MRAM may not include the magnetic field-generating layer. In the spin-injection MRAM, a current is allowed to flow between an upper electrode and a lower electrode in the direction perpendicular to the MTJ element (positive direction or negative direction), causing magnetization reversal (current scalability) due to electron spin torque passing through a junction surface of the MTJ element. Since the memory cell of the spin-injection MRAM does not have the magnetic-field-generating layer, the area of the memory cell may be reduced.

In the memory cell of an MRAM, the area of the lower electrode may be larger than that of the upper electrode and than that of the MTJ element. A lower electrode film, an MTJ film, and an upper electrode film are sequentially formed. The upper electrode film and the MTJ film are patterned by etching to form the upper electrode and the MTJ element, and the lower electrode film is patterned to form the lower electrode. When the lower electrode film is patterned in the state that the side surface of the MTJ element is exposed, the MTJ element will be damaged by, for example, plasma in an ashing process of a resist used as a mask for the etching and may be damaged by etching gas in the etching.

After patterning of the lower electrode film by etching, the resist mask used in the etching is removed by ashing to expose a surface covered by the lower electrode film and the surface of a lower layer wiring or a conductive plug. By the ashing, the conductive member such as the lower layer wiring or the conductive plug may be oxidized.

FIGS. 1A to 1C, 2A to 2C, 3A to 3D, 4A to 4D, 5A to 5D, 6A to 6D, 7A to 7C, 8A to 8C, and 9 illustrates an exemplary method of manufacturing an MRAM. As illustrated in FIG.

1A, MOS transistors 20 corresponding to the selection transistors of a memory cell are formed on a silicon semiconductor substrate 10. Element-separating structures 11 are formed on the surface layer of the silicon semiconductor substrate 10 by, for example, a shallow trench isolation process (STI process) to define an element active region.

An impurity is injected into the element active region. For example, a P-type impurity is ion-injected in an N-type MOS transistor, and an N-type impurity is ion-injected in a P-type MOS transistor. For example, in an N-type transistor, boron (B) is ion-injected as a P-type impurity, for example, under conditions of a dose of $3.0\times10^{13}/cm^2$ and an acceleration energy of 300 keV. A well 12 may be formed.

In the element active region, for example, a thin gate insulating film 13 having a thickness of about 3.0 nm is formed by, for example, thermal oxidation, and, for example, a polycrystalline silicon film having a thickness of about 180 nm and a silicon nitride film having a thickness of about 29 nm are deposited on the gate insulating film 13 by a CVD process. The silicon nitride film, the polycrystalline silicon film, and the gate insulating film 13 are patterned into an electrode shape by lithography and dry etching. Thus, a gate electrode 14 is formed on the gate insulating film 13. Contemporaneously, a cap film 15 made of the silicon nitride film may be formed on the gate electrode 14.

An impurity is injected into the element active region using the cap film 15 as a mask. For example, an N-type impurity is ion-injected for forming an N-type MOS transistor, and a P-type impurity is ion-injected for forming a P-type MOS transistor. For example, arsenic (As) is ion-injected as a P-type impurity, for example, under conditions of a dose of $5.0\times10^{14}/cm^2$ and an acceleration energy of 10 keV. Thus, extension regions 16 are formed.

For example, a silicon oxide film is deposited on the entire surface by a CVD process, and the silicon oxide film is etched back. The silicon oxide film remains on the side surfaces of the gate electrode 14 and the cap film 15 to form a side wall insulating film 17.

An impurity, for example, an N-type impurity such as P is ion-injected into the element active region using the cap film 15 and the side wall insulating film 17 as masks under conditions such that the concentration of the impurity in the element active region is higher than that in the extension region 16. Thus, a source/drain region 18 partially superimposed on the extension region 16 is formed, and an MOS transistor 20 is formed.

Figure 1B:
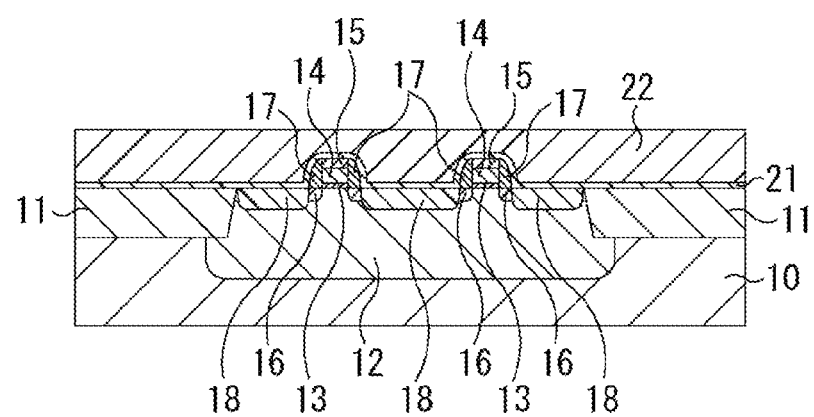

As illustrated in FIG. 1B, a protective film 21 of the MOS transistors 20 and an interlayer insulating film 22 may be sequentially formed. The protective film 21 and the interlayer insulating film 22 may be sequentially formed so as to cover the MOS transistors 20. The protective film 21 may include, for example, a silicon nitride film and be deposited by a CVD process to have a thickness of about 130 nm. The interlayer insulating film 22, for example, a plasma TEOS film having a thickness of about 1300 nm is deposited. The surface of the interlayer insulating film 22 is planarized by polishing to have a thickness of about 700 nm by chemical mechanical polishing (CMP).

Figure 1C:
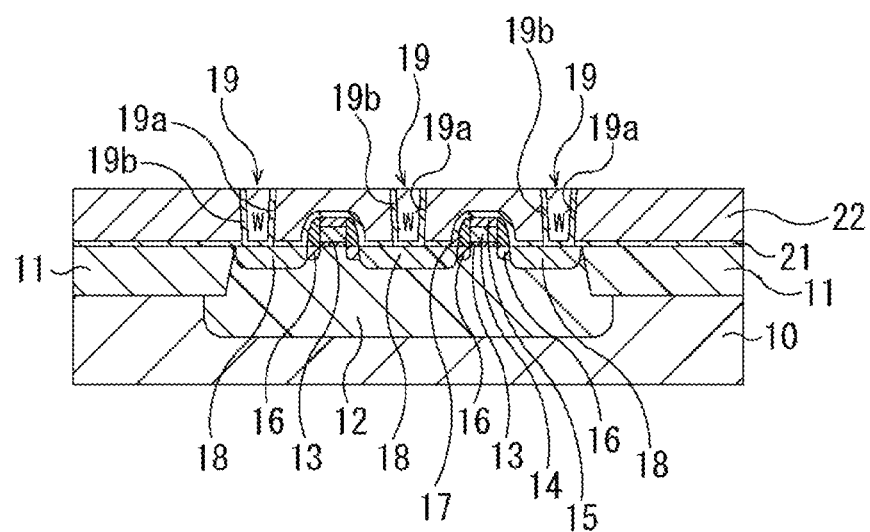

As illustrated in FIG. 1C, conductive plugs 19 to be coupled to the source/drain regions 18 of the MOS transistors 20 are formed. The interlayer insulating film 22 and the protective film 21 are patterned by lithography and dry etching using the source/drain regions 18 as an etching stopper till the surfaces of the source/drain regions 18 are each partially exposed. For example, contact-holes 19a each having a diameter of about 0.3 μm are formed.

A base film, for example, a glue film 19b is formed by depositing, for example, a Ti film having a thickness of about 20 nm and a TiN film having a thickness of about 50 nm by sputtering so as to cover the inner surface of each contact-hole 19a. Then, for example, a W film is deposited by a CVD process so as to plug the contact-hole 19a through the glue film 19b. The W film and the glue film 19b are polished by CMP using the interlayer insulating film 22 as a polishing stopper. Thus, a conductive plug 19 that plugs the contact-hole 19a with W through the glue film 19b is formed.

Figure 2A:
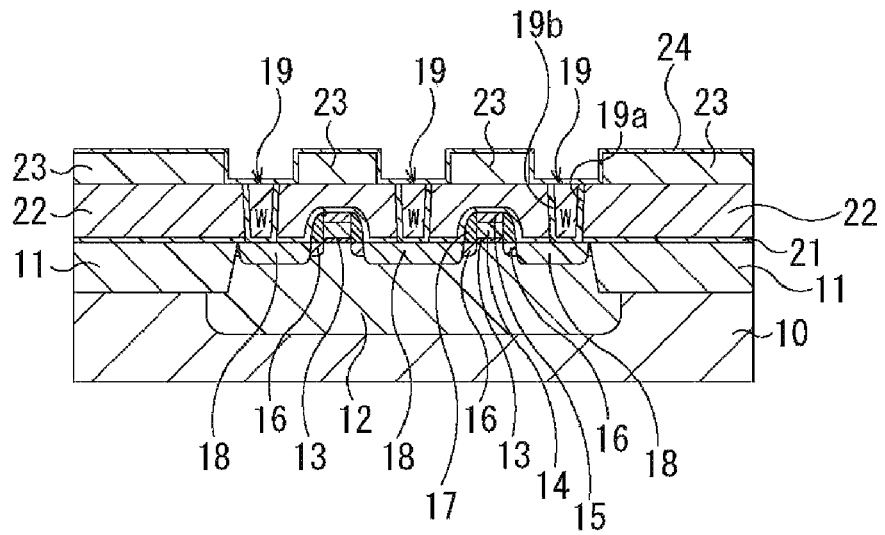
FIGS. 2A to 2C illustrate an exemplary method of manufacturing an MRAM.

Wirings 25 are formed by a damascene process, for example, a single-damascene process. As illustrated in FIG. 2A, an interlayer insulating film 23 is formed by depositing an insulating film, for example, a silicon oxide film having a thickness of about 150 nm on the interlayer insulating film 22 by, for example, a CVD process. The interlayer insulating film 23 is patterned by lithography and subsequent dry etching so that the surface of the conductive plug 19 for wiring connection is exposed to form a wiring gutter 23a having a wiring shape in the interlayer insulating film 23.

Figure 2B:
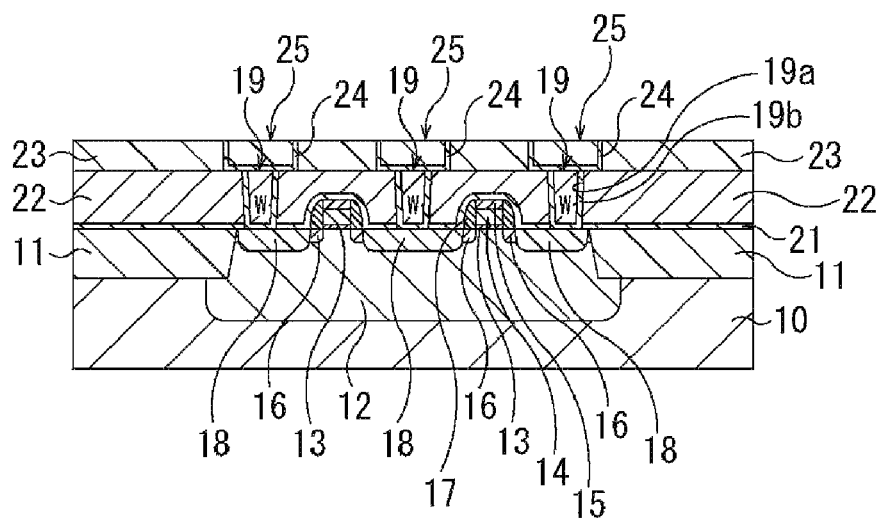

As illustrated in FIG. 2B, a glue film 24 is formed by, for example, depositing a Ta film having a thickness of about 5 nm on the interlayer insulating film 23 so as to cover the inner surface of the wiring gutter 23a by, for example, sputtering. A plating seed layer (not shown) is formed on the glue film 24, and the wiring gutter 23a is plugged with Cu (or a Cu alloy material) through the glue film 24 by plating. The Cu (or the Cu alloy material) on the interlayer insulating film 23 and the glue film 24 are polished and planarized by CMP using the interlayer insulating film 23 as a polishing stopper. By the planarization, the wiring gutter 23a is filled with Cu (or the Cu alloy material) to form a wiring 25 coupled to the conductive plug 19.

Wiring structures 36 are formed by a damascene process, for example, a dual-damascene process. In FIGS. 2C and 3A to 3C, the interlayer insulating film 23 and portions above the interlayer insulating film 23 may be illustrated.

Figure 2C:
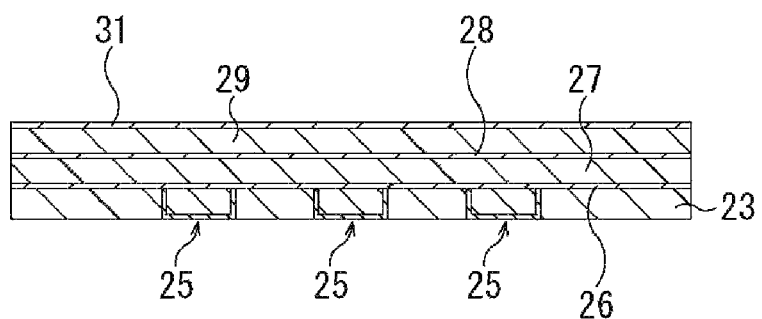

As illustrated in FIG. 2C, an insulating film as a diffusion-preventing film 26 for preventing diffusion of Cu (or the Cu alloy material) in the wirings 25 is formed by, for example, depositing a SiC film having a thickness of about 30 to 70 nm on the interlayer insulating film 23 by, for example, a CVD process. An interlayer insulating film 27 is formed by depositing an insulating film, for example, a SiOC film having a thickness of about 400 to 700 nm on the diffusion-preventing film 26 by, for example, a CVD process. An etching stopper film 28 is formed by depositing an insulating film, for example, a SiC film having a thickness of about 30 to 70 nm on the interlayer insulating film 27 by, for example, a CVD process. An interlayer insulating film 29 is formed by depositing an insulating film, for example, a SiOC film having a thickness of about 300 to 600 nm on the etching stopper film 28 by, for example, a CVD process. A diffusion-preventing film 31 is formed by depositing, for example, a SiC film having a thickness of 50 to 100 nm on the interlayer insulating film 29.

Figure 3A:
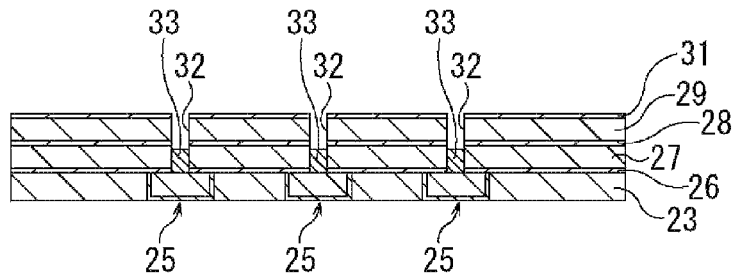
FIGS. 3A to 3D illustrate an exemplary method of manufacturing an MRAM.

As illustrated in FIG. 3A, via-holes 32 passing through the diffusion-preventing film 31, the interlayer insulating layer 29, the etching stopper film 28, and the interlayer insulating film 27 are formed by lithography and dry etching, and the surface of the diffusion-preventing film 26 is exposed. A resin material layer 33 (embedded material layer) is formed on the diffusion-preventing film 31 so as to plug each via-hole 32. The entire surface of the resin material layer 33 is dry-etched, for example, in such a manner that the resin material layer 33 with a certain thickness remains in the via-hole 32. The thickness of the resin material layer 33 may be smaller than the thickness of the interlayer insulating film 27. The resin material layer 33 having a certain thickness may remain in the via-hole 32 by being developed.

Figure 3B:
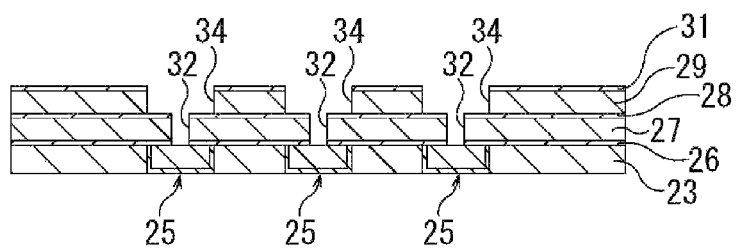

As illustrated in FIG. 3B, the diffusion-preventing film 31 and the interlayer insulating layer 29 are patterned by lithography and dry etching to form wiring gutters 34 having a wiring shape. The wiring gutter 34 is formed using the etching stopper film 28 as a stopper so as to be communicated with the via-hole 32 provided in the etching stopper film 28 and the interlayer insulating film 27. The resin material layer 33 remaining in the via-hole 32 is removed by, for example, ashing.

Figure 3C:
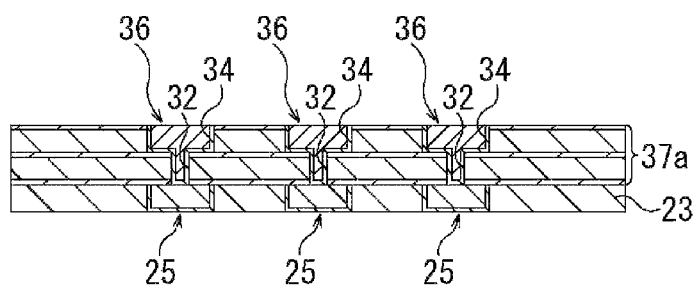

As illustrated in FIG. 3C, a glue film 35 is formed by, for example, depositing a Ta film having a thickness of about 5 nm on the diffusion-preventing film 31 by, for example, sputtering so as to cover the inner surfaces of the via-hole 32 and the wiring gutter 34. A plating seed layer (not illustrated) is formed on the glue film 35, and the via-hole 32 and the wiring gutter 34 are plugged with Cu or a Cu alloy material through the glue film 35 by plating. The Cu or the Cu alloy material and the glue film 35 on the diffusion-preventing film 31 are polished and planarized by CMP using the surface of the diffusion-preventing film 31 as a polishing stopper. The insides of the via-holes 32 and the wiring gutters 34 are filled with Cu or the Cu alloy material through the glue film 35 to form wiring structures 36 electrically coupled to the wirings 25. The insulating layer form a wiring layer 37a includes an insulating layer having the diffusion-preventing film 26, the interlayer insulating film 27, the etching stopper film 28, the interlayer insulating layer 29, and the diffusion-preventing film 31, and the wiring structures 36 in the insulating layer.

Figure 3D:
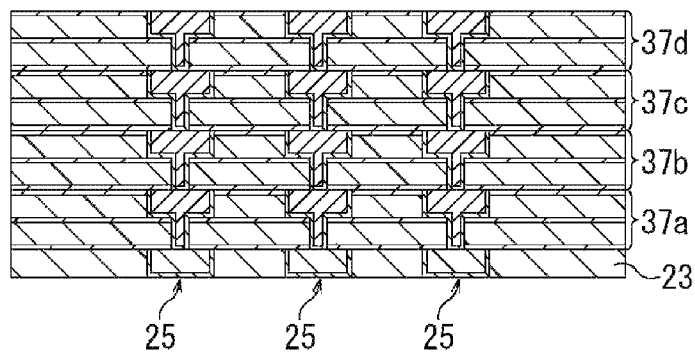

The dual-damascene process illustrated in FIGS. 2C and 3A to 3C may be repeated a certain number of times, for example, three times. As illustrated in FIG. 3D, three wiring layers 37b, 37c, and 37d each having a structure that is substantially the same as or similar to that of the wiring layer 37a are stacked on the wiring layer 37a illustrated in FIG. 3C so as to be coupled to the wiring structures 36. The wiring structure may be a multiple-wiring structure.

Figure 4A:
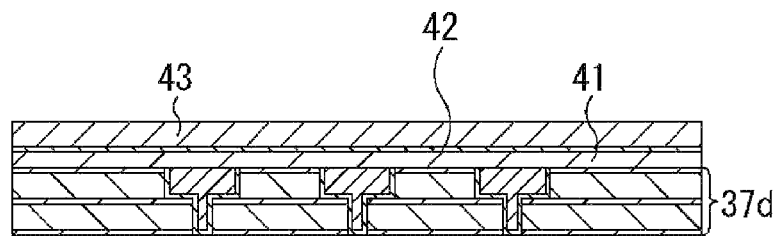
FIGS. 4A to 4D illustrate an exemplary method of manufacturing an MRAM.

As illustrated in FIG. 4A, a lower electrode film 41, an MTJ film 42, and an upper electrode film 43 are sequentially formed by, for example, sputtering. In FIGS. 4A to 4D, 5A to 5D, 6A to 6D, 7A to 7C, and 8A to 8C, the wiring layer 37d and portions upper than the wiring layer 37d may be illustrated.

For example, a Ru film and a Ta film are deposited so as to have thicknesses of about 20 nm and about 40 nm, respectively, so as to cover the wiring layer 37d. Thus, a lower electrode film 41 is formed. On the lower electrode film 41, for example, a PtMn film having a thickness of about 15 nm, a CoFe film having a thickness of about 3 nm, a CoFeB film having a thickness of about 2 nm, a MgO film having a thickness of about 1 nm, and a CoFeB film having a thickness of about 2 nm are deposited. The PtMn film may correspond to an antiferromagnetic layer. The CoFe film and the CoFeB film may correspond to pinned magnetic films. The MgO film may correspond to a tunnel oxide film. The CoFeB film may correspond to a free magnetic film. Thus, a magnetic film (MTJ film) 42 is formed. On the MTJ film 42, for example, a Ru film having a thickness of about 10 nm and a Ta film having a thickness of about 50 nm are sequentially deposited. Thus, an upper electrode film 43 is formed. The lower electrode film 41, the MTJ film 42, and the upper electrode film 43 are formed by sputtering, for example, using Ar as the sputtering gas at a pressure of 0.5 Pa and an input power of 500 W.

Figure 4B:
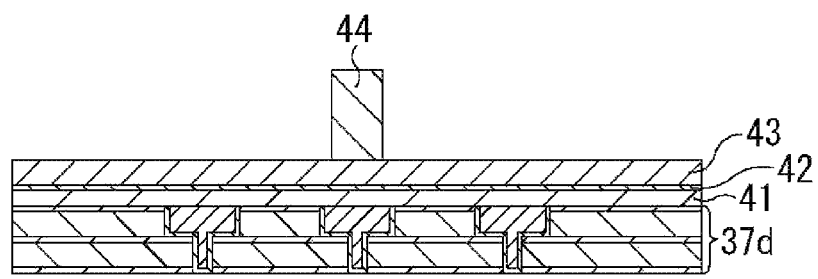

As illustrated in FIG. 4B, a resist pattern 44 is formed on the upper electrode film 43. The resist pattern 44 may be formed by, for example, applying a resist for ArF exposure on the upper electrode film 43 so as to have a thickness of about 200 nm and patterning the resist by photolithography into a shape and a size corresponding to the upper electrode. The resist pattern 44 may be a rectangular pattern, for example, with a size of about 100×150 nm.

Figure 4C:
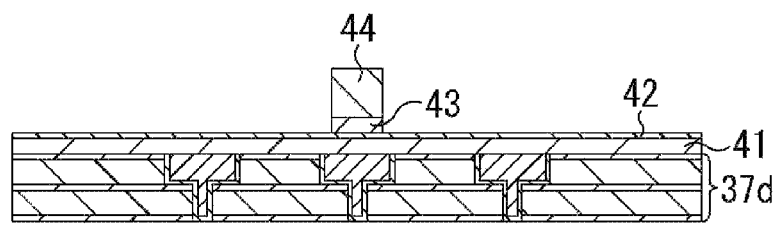

As illustrated in FIG. 4C, the upper electrode film 43 is etched. The upper electrode film 43 may be dry-etched using the resist pattern 44 as a mask. The dry etching may etch the Ta film included in the upper electrode film 43 without etching the Ru film. The etching may be performed, for example, using a gas mixture of $Cl_2$ (at a flow rate of 20 sccm) and $BCl_3$ (at a flow rate of 60 sccm) as the etching gas at a pressure of 2 Pa and an RF input power of 500 W.

Figure 4D:
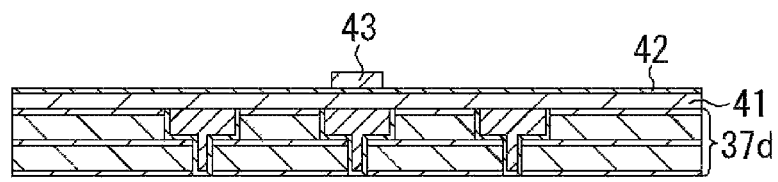

As illustrated in FIG. 4D, the resist pattern 44 is removed. The resist pattern 44 is removed by, for example, ashing using oxygen plasma. The ashing may be performed, for example, using $O_2$ at a flow rate of 100 scm at a pressure of 10 Pa and an RF input power of 300 W. The ashing etches by about 5 nm of the Ru film exposed in the outside of the region where the upper electrode film 43 is formed. Since the ashing is performed in the state that the MTJ film 42 is covered by the Ru film included in the upper electrode film 43, oxidation of the MTJ film 42 due to the ashing is reduced.

Figure 5A:
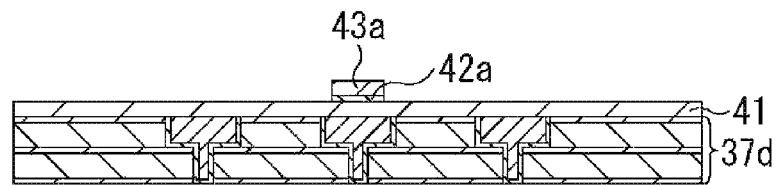
FIGS. 5A to 5D illustrate an exemplary method of manufacturing an MRAM.

As illustrated in FIG. 5A, the Ru film and the MTJ film 42 exposed in the outside of the region where the upper electrode film 43 is formed are etched. The exposed Ru film and MTJ film 42 are dry-etched using the patterned upper electrode film 43 as a mask. The dry etching may etch the Ru film and the MTJ film 42 without etching the lower electrode film 41. The dry etching may be performed, for example, using $CH_3OH$ (at a flow rate of 100 sccm) as the etching gas at a pressure of 2 Pa and an RF input power of 800 W. The upper electrode film 43 is etched to form an upper electrode 43a, and the MTJ film 42 is etched to form an MTJ 42a. Since the etching of the Ru film and the MTJ film 42 is performed without using a resist mask, ashing of a resist after the etching may not be performed. Therefore, oxidization due to ashing may be reduced on the side surfaces of the MTJ 42a.

Figure 5B:
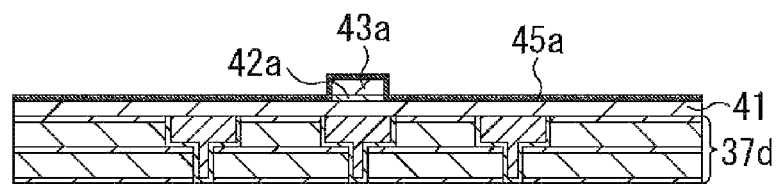

As illustrated in FIG. 5B, a protective film 45a is formed by depositing an insulating film, for example, a SiC film having a thickness of about 20 to 60 nm on the lower electrode film 41 so as to cover the MTJ 42a and the upper electrode 43a by, for example, a CVD process. The protective film 45a may include, for example, SiN, SiCN, or carbon instead of SiC.

Figure 5C:
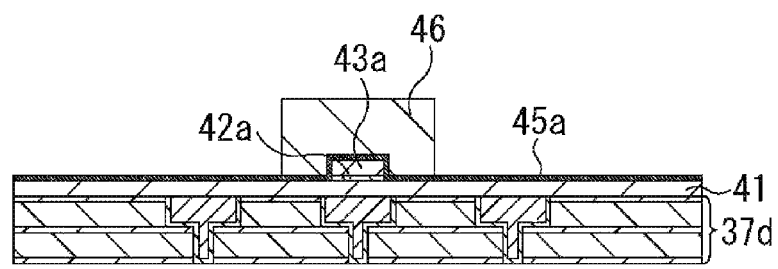

As illustrated in FIG. 5C, a resist pattern 46 is formed. The resist pattern 46 covering the MTJ 42a and the upper electrode 43a through the protective film 45a is formed by, for example, applying on the protective film 45a a trilevel resist for ArF exposure having a thickness of about 200 nm or a resist for KrF exposure having a thickness of about 500 nm and patterning the resist by photolithography into a shape and a size corresponding to a lower electrode. The resist pattern 46 may be a rectangular pattern, for example, with a size of about 200×400 nm.

Figure 5D:
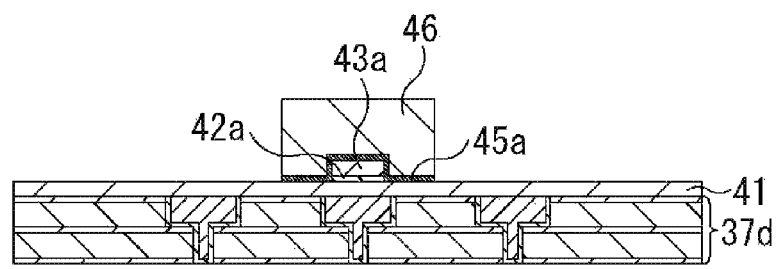

As illustrated in FIG. 5D, the protective film 45a is etched. The protective film 45a may be dry-etched using the resist pattern 46 as a mask. The dry etching may etch the protective film 45a without etching the lower electrode film 41. The dry etching may be performed using $CF_4$ (at a flow rate of 100 sccm) as the etching gas at a pressure of 5 Pa and an RF input power of 400 W.

Figure 6A:
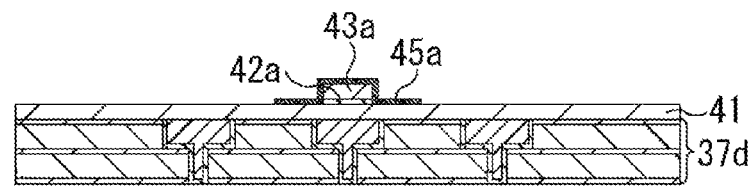
FIGS. 6A to 6D illustrate an exemplary method of manufacturing an MRAM.

As illustrated in FIG. 6A, the resist pattern 46 is removed. The resist pattern 46 is removed by ashing using oxygen plasma. The ashing may be performed, for example, using $O_2$ at a flow rate of 100 scm at a pressure of 10 Pa and an RF input power of 200 W. The ashing may be performed in the state that the side surface of the MTJ 42a is covered by the protective film 45a. Therefore, oxidation of the side surface of the MTJ film 42 due to the ashing may be reduced. Since the ashing is performed in the state that the surface of the wiring structure 36 of the wiring layer 37d is covered by the lower electrode film 43, oxidation due to ashing of the surface of the wiring structure 36 of the wiring layer 37d may be reduced.

Figure 6B:
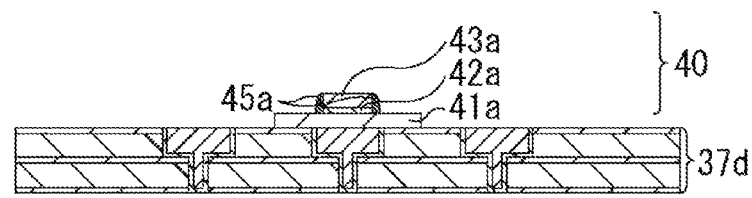

As illustrated in FIG. 6B, the lower electrode film 41 is etched. The lower electrode film 41 may be dry-etched using the patterned protective film 45a as a mask. The dry etching may etch the lower electrode film 41 without etching the wiring layer 37d, for example, the diffusion-preventing film 31. The etching may be performed, for example, using a gas mixture of $Cl_2$ (at a flow rate of 20 sccm) and $BCl_3$ (at a flow rate of 60 sccm) as the etching gas at a pressure of 2 Pa and an RF input power of 500 W. By the etching, the lower electrode film 41 is etched to form a lower electrode 41a, and an MTJ element 40 having the lower electrode 41a, the MTJ 42a, and the upper electrode 43a is formed. The protective film 45a is etched (etched back) and remains as a side wall film 45a covering the side surfaces of the MTJ 42a and the upper electrode 43a. Since the etching of the lower electrode film 41 is performed without using a resist mask, ashing of a resist after the etching may not be performed. Therefore, oxidization due to ashing may be reduced on the surface of the wiring structure 36 of the wiring layer 37d.

Figure 6C:
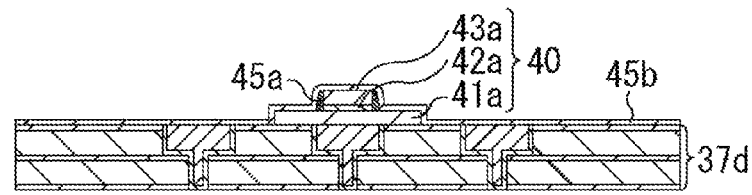

As illustrated in FIG. 6C, a protective film 45b is formed. The protective film 45b may be formed as an insulating film by, for example, depositing a SiC film having a thickness of about 15 to 50 nm, for example, a thickness of about 30 nm on the wiring layer 37d so as to cover the MTJ 42a, the upper electrode 43a, and the protective film 45a by, for example, a CVD process. The protective film 45b may include, for example, SiN, SiCN, or carbon instead of SiC. The protective films 45a and 45b may include the same material or different materials selected from SiC, SiN, SiCN, and carbon.

The protective film 45b is stacked on the protective film 45a, and the protective films 45a and 45b having a total thickness of about 60 nm cover the side surfaces of the MTJ 42a and the upper electrode 43a. The MTJ 42a and the upper electrode 43a are covered by the protective film 45b at regions other than the side surfaces. Since the side surface of the MTJ 42a is covered by the protective films 45a and 45b, process damage to the MTJ 42a may be reduced. The regions other than the side surface, such as the upper surface of the upper electrode 43a, are covered by the protective film 45b for providing conduction to the upper electrode 43a. For example, the upper surface of the upper electrode 43a may be exposed by, for example, etching. The protective film 45b may reduce diffusion of Cu in the wiring structure 36 of the wiring layer 37d.

Figure 6D:
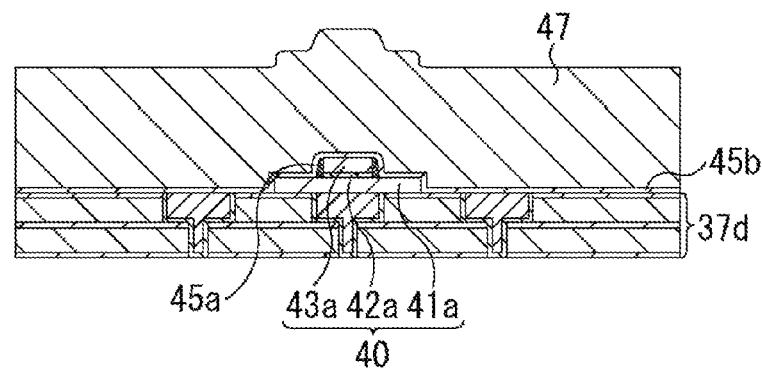

As illustrated in FIG. 6D, an interlayer insulating film 47 is formed. The interlayer insulating film 47 is formed by, for example, forming a SiOC film having a thickness of about 100 to 500 nm, for example, a thickness of about 250 nm so as to cover the protective film 45b by, for example, a CVD or application process. The interlayer insulating film 47 may include, for example, a low-dielectric film (low-k film) or $SiO_2$ instead of SiOC.

Figure 7A:
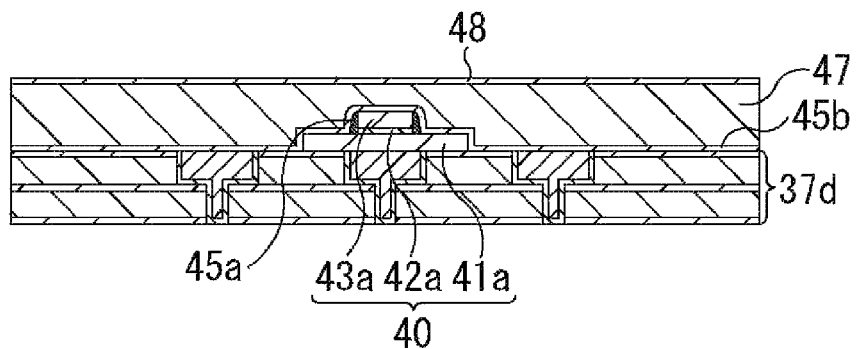
FIGS. 7A to 7C illustrate an exemplary method of manufacturing an MRAM.

As illustrated in FIG. 7A, the surface of the interlayer insulating film 47 is planarized, and a diffusion-preventing film 48 is formed thereon. The interlayer insulating film 47 is planarized by polishing its surface layer by CMP. An insulating film as the diffusion-preventing film 48, for example, a SiC film having a thickness of about 30 to 70 nm, for example, a thickness of about 30 nm is deposited on the interlayer insulating film 47 having the planarized surface. The diffusion-preventing film 48 may reduce diffusion of Cu in the wiring structure.

Figure 7B:
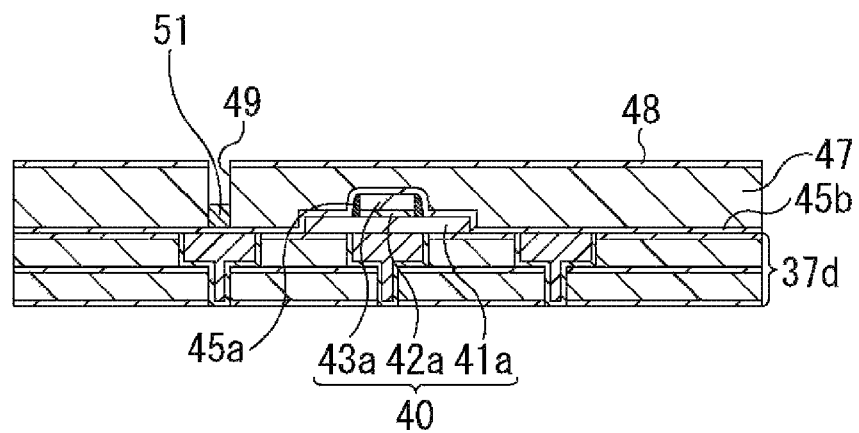

The wiring structure and the wiring are formed by a damascene process, for example, a dual-damascene process. As illustrated in FIG. 7B, in the wiring structure 36 not being provided with the lower electrode 41a on the upper portion of the wiring layer 37d, the diffusion-preventing film 48 and the interlayer insulating film 47 are patterned by lithography and dry etching. The diffusion-preventing film 48 and the interlayer insulating film 47 are etched using the protective film 45b as an etching stopper till the surface of the protective film 45b on the wiring structure 36 is partially exposed. A via-hole 49 passing through the diffusion-preventing film 48 and the interlayer insulating film 47 is formed. A resin material layer 51 (embedded material layer) is formed on the diffusion-preventing film 48 to plug the via-hole 49. The resin material layer 51 is dry-etched in such a manner that the resin material layer 51 with a certain thickness remains in the via-hole 49.

Figure 7C:
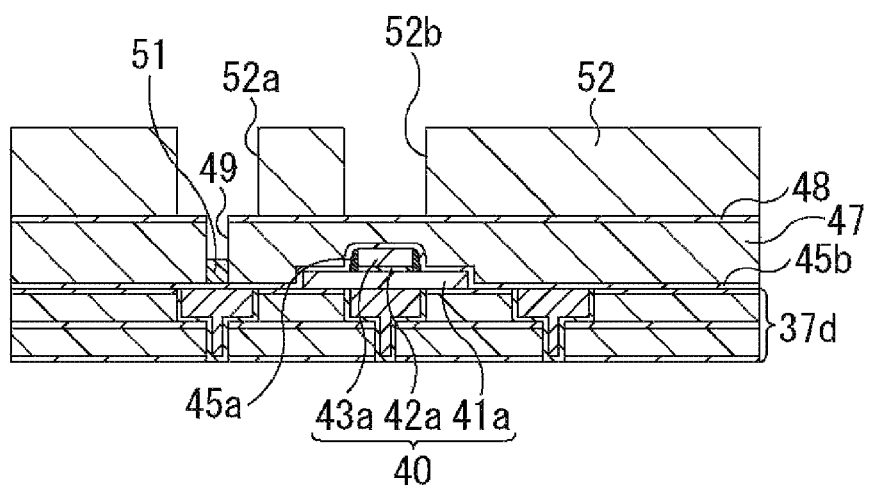

As illustrated in FIG. 7C, a resist pattern 52 is formed by applying a resist on the diffusion-preventing film 48 and patterning the resist by lithography. In the resist pattern 52, an opening 52a having a wiring shape is formed at a position where the via-hole 49 is formed on the diffusion-preventing film 48 and an opening 52b having a wiring shape is formed at a position corresponding to the upper position of the upper electrode 43a.

Figure 8A:
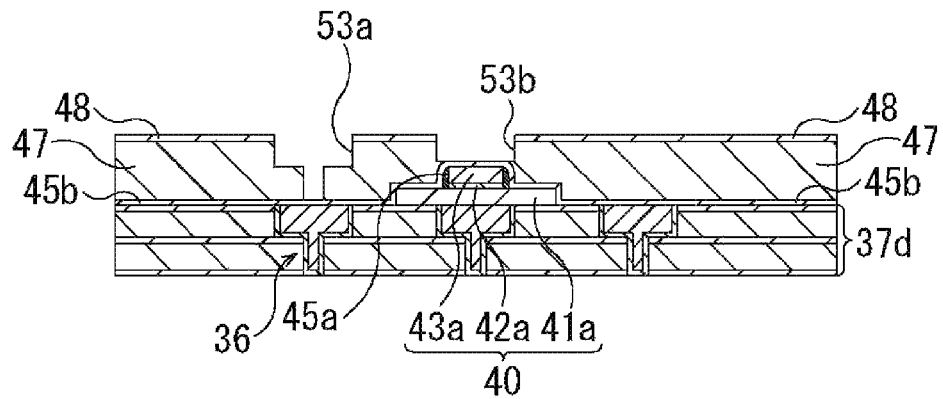
FIGS. 8A to 8C illustrate an exemplary method of manufacturing an MRAM.

As illustrated in FIG. 8A, the diffusion-preventing film 48 and the interlayer insulating film 47 are dry-etched till the surface of the protective film 45b is partially exposed using the resist pattern 52 as a mask and the protective film 45b on the upper electrode 43a as an etching stopper. The etching gas for the dry etching may be, for example, $CF_4$. A wiring gutter 53a communicating with the via-hole 49 and a wiring gutter 53b having a bottom on which a portion of the surface of the protective film 45b on the upper electrode 43a is exposed may be contemporaneously formed. The resist pattern 52 and the resin material layer 51 remaining in the via-hole 49 are removed by ashing. Since the ashing is performed in the state that the upper surface of the upper electrode 43a is covered by the protective film 45b, oxidation of the upper electrode 43a due to the ashing may be reduced.

Figure 8B:
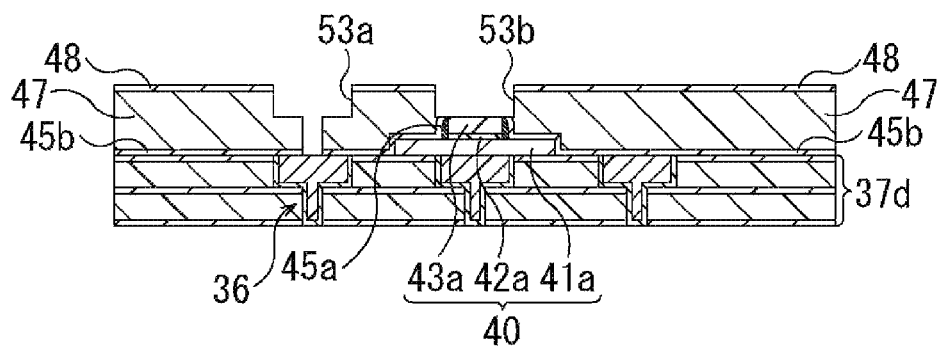

As illustrated in FIG. 8B, the protective film 45b exposed at the bottom surface of the via-hole 49 and the protective film 45b exposed at the bottom surface of the wiring gutter 53b are dry-etched using the diffusion-preventing film 48 as a mask. The etching gas for the dry etching may be, for example, a gas mixture of $CH_2F_2$, $O_2$, and $N_2$. The surface of the wiring structure 36 of the wiring layer 37d is partially exposed at the bottom surface of the via-hole 49, and the surface of the upper electrode 43a is partially exposed at the bottom surface of the wiring gutter 53b. Since the etching of the protective film 45b is performed without using a resist mask, ashing of a resist after the etching may not be performed. Therefore, no oxidization due to ashing occurs in the upper electrode 43a. The protective film 45b on the upper electrode 43a may be etched using the diffusion-preventing film 48 as a mask.

Figure 8C:
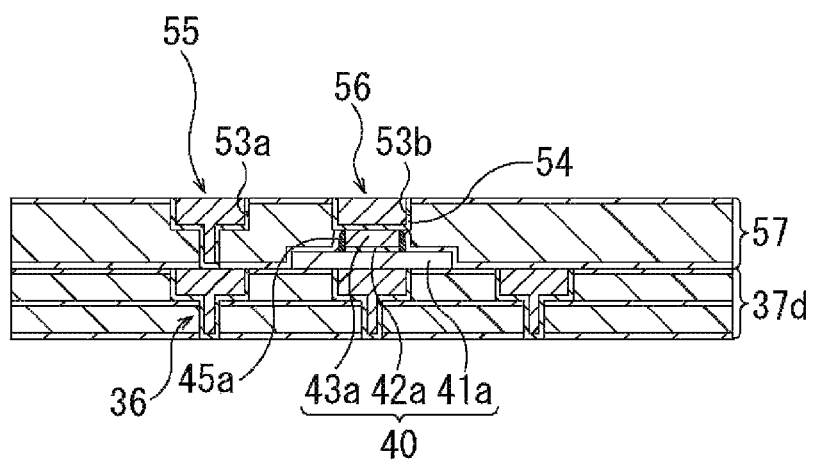

As illustrated in FIG. 8C, a glue film 54 is formed by, for example, depositing a Ta film having a thickness of about 5 nm on the diffusion-preventing film 48 by, for example, sputtering so as to cover the inner surface of the unified via-hole 49 and the wiring gutter 53a and the inner surface of the wiring gutter 53b. A plating seed layer (not illustrated) is formed on the glue film 54, and the via-hole 49 and the wiring gutter 53a and the wiring gutter 53b are plugged with Cu or a Cu alloy material through the glue film 54 by plating. The Cu or the Cu alloy material on the diffusion-preventing film 48 and the glue film 54 are polished and planarized by CMP using the surface of the diffusion-preventing film 48 as a polishing stopper. The via-hole 49 and the wiring gutter 53a are filled with Cu or the Cu alloy material through the glue film 54 by the planarization to form a wiring structure 55 being electrically coupled with the wiring structure 36. The wiring gutter 53b may be contemporaneously filled with Cu or the Cu alloy material through the glue film 54 to form a wiring 56 being electrically coupled with the upper electrode 43a. The wiring layer 57 may include an insulating layer having the protective films 45a and 45b, the interlayer insulating film 47, and the diffusion-preventing film 48 and include a structure having the MTJ element 40 formed in the insulating layer, the wiring structure 55, and the wiring 56.

In the wiring layer 57, the MTJ element 40 may be coupled to the wiring 56 without through the via-hole portion. The wiring structure 55 and the wiring 56 may be contemporaneously formed in one process, thereby reducing a number of manufacturing processes.

Figure 9:
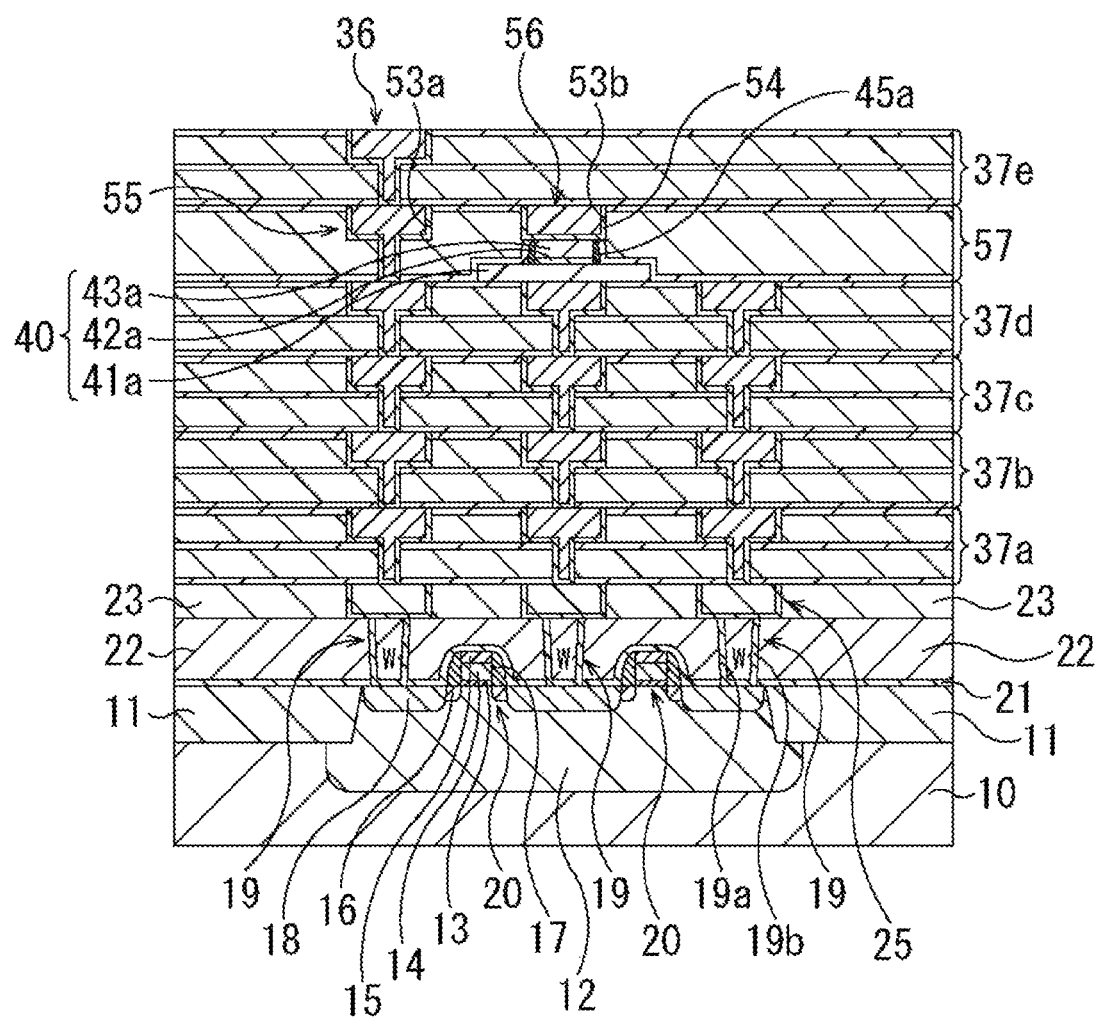
FIG. 9 illustrates an exemplary method of manufacturing an MRAM.

As illustrated in FIG. 9, by the dual-damascene process illustrated in FIGS. 2C and 3A to 3C, a wiring layer 37e, having a structure that is substantially the same as those of the wiring layers 37a to 37d and having a wiring structure 36 that is electrically coupled with at least one of the wiring structure 55 and the wiring 56 on the wiring layer 57, is formed.

An upper wiring layer, a protective film, and a pad electrode are formed, and thereby an MRAM is formed.

Figure 10:
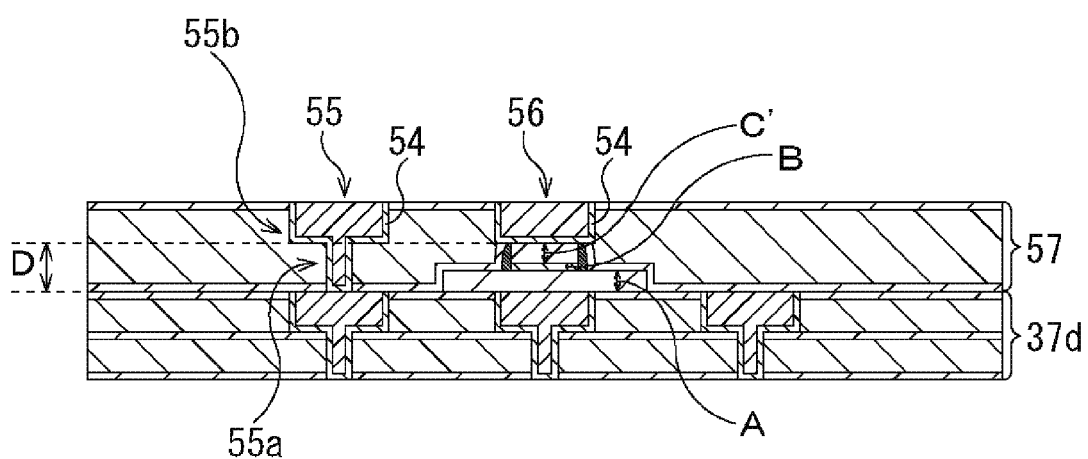
FIG. 10 illustrates an exemplary MRAM.

FIG. 10 illustrates an exemplary MRAM. As illustrated in FIG. 10, the MTJ element 40 is coupled to the wiring 56 without passing through the via-hole portion in the wiring layer 57. The upper surface of the MTJ element 40 and the upper surface of the via-hole portion 55a of the wiring structure 55 are substantially the same level, and the upper surface of the wiring 56 and the upper surface of the wiring gutter portion 55b of the wiring structure 55 are substantially the same level. The thickness "A" of the lower electrode 41a of the MTJ element 40, the thickness "B" of the MTJ 42a, the thickness "C" of the upper electrode film 43 before patterning, the thickness "C'" of the upper electrode 43a considering the selection ratio in etching of the Ru film of the upper electrode film 43 and the MTJ film 42, and the height (thickness) "D" of the via-hole portion 55a of the wiring structure 55 satisfy the following relational expression:

$$D=A+B+C'$$

Since the thickness of the MTJ 42a is about 20 to 30 nm, the thickness "A" of the lower electrode 41a and the thickness "C'" of the upper electrode film 43 when they are formed are determined so as to satisfy the relational expression.

Damage to the MTJ element 40 when the MRAM having the MTJ element 40 is manufactured may be reduced. Since ashing is not performed when the lower electrode film 41 is patterned, oxidation of the wiring structures 36 lying under the lower electrode film 41, which include the conductive member, may be reduced. As a result, an MRAM having high reliability may be provided.

Via-holes may be formed in the upper electrode 43a.

Figure 11A:
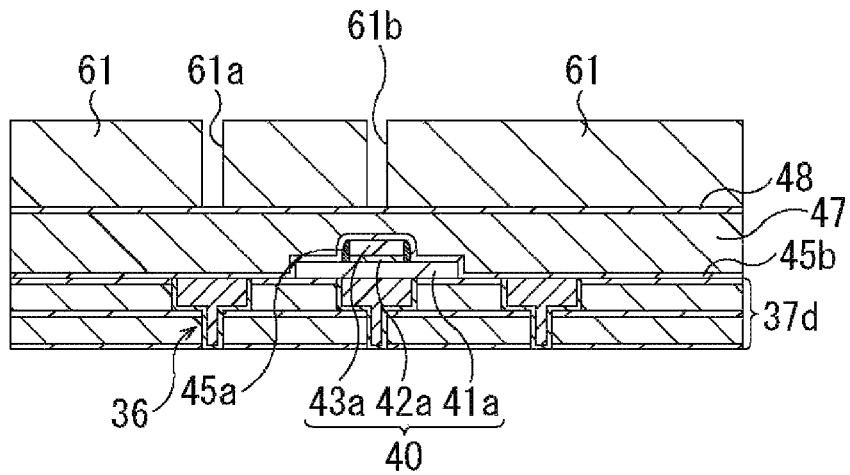
FIGS. 11A to 11C illustrate an exemplary method of manufacturing a MRAM.
Figure 11B:
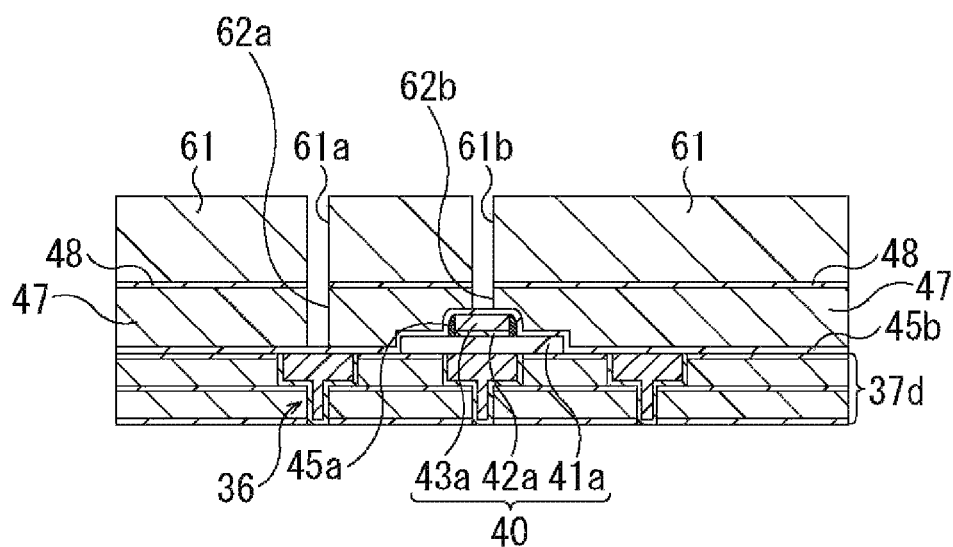
Figure 11C:
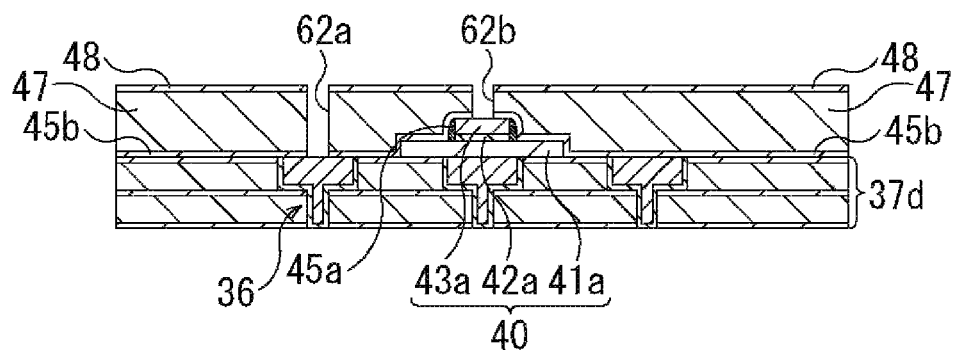

FIGS. 11A to 11C illustrate an exemplary method of manufacturing an MRAM. In FIGS. 11A and 11C, substantially the same elements as those of FIGS. 1A to 1C, 2A to 2C, 3A to 3D, 4A to 4D, 5A to 5D, 6A to 6D, 7A to 7C, 8A to 8C, 9, and 10 are given the same reference numerals, and descriptions thereof may be omitted or reduced. As illustrated in FIG. 11A, a resist pattern 61 is formed by applying a resist on the diffusion-preventing film 48 and patterning the resist by lithography. The resist pattern 61 is provided with an opening 61a at the position corresponding to the wiring structure 36 not having the lower electrode 41a in the wiring layer 37d and an opening 61b having a wiring shape at the position corresponding to the upper electrode 43a.

As illustrated in FIG. 11B, the diffusion-preventing film 48 and the interlayer insulating film 47 are dry-etched till the surface of the protective film 45b is partially exposed using the resist pattern 61 as a mask and the protective film 45b as an etching stopper. The etching gas for the dry etching may be, for example, $CF_4$. A via-hole 62a is formed so that the surface of the protective film 45b on the wiring structure 36 is exposed, and a via-hole 62b is formed so that the surface of the protective film 45b on the upper electrode 43a is exposed. The resist pattern 61 is removed by ashing. Since the ashing is performed in the state that the upper surface of the upper electrode 43a is covered by the protective film 45b, oxidation due to ashing of the upper electrode 43a may be reduced.

As illustrated in FIG. 11C, the protective film 45b exposed at the bottom surfaces of the via-holes 62a and 62b is dry-etched using the diffusion-preventing film 48 as a mask. The surface of the wiring structure 36 is partially exposed at the bottom surface of the via-hole 62a, and the surface of the upper electrode 43a is partially exposed at the bottom surface of the via-hole 62b. Since the protective film 45b is etched without using a resist mask, ashing of a resist after the etching may not be performed. Therefore, oxidization due to ashing may not occur in the upper electrode 43a. Since the protective film 45b on the upper electrode 43a is thin, the protective film 45b may be etched using the diffusion-preventing film 48 as a mask.

For example, the via-holes 62a and 62b are each filled with, for example, W through a glue film to form conductive plugs, and wirings coupled to the corresponding conductive plugs are formed by a single damascene process. An upper wiring layer, a protective film, and a pad electrode are formed, and then an MRAM is formed.

Damage to the MTJ element 40 when the MRAM having the MTJ element 40 is manufactured may be reduced. Since ashing is not performed when the lower electrode film 41a is patterned, oxidation of the wiring structures 36 lying under the lower electrode film 41a, which include the conductive member, may be reduced. As a result, an MRAM having high reliability may be provided.

Figure 12A:
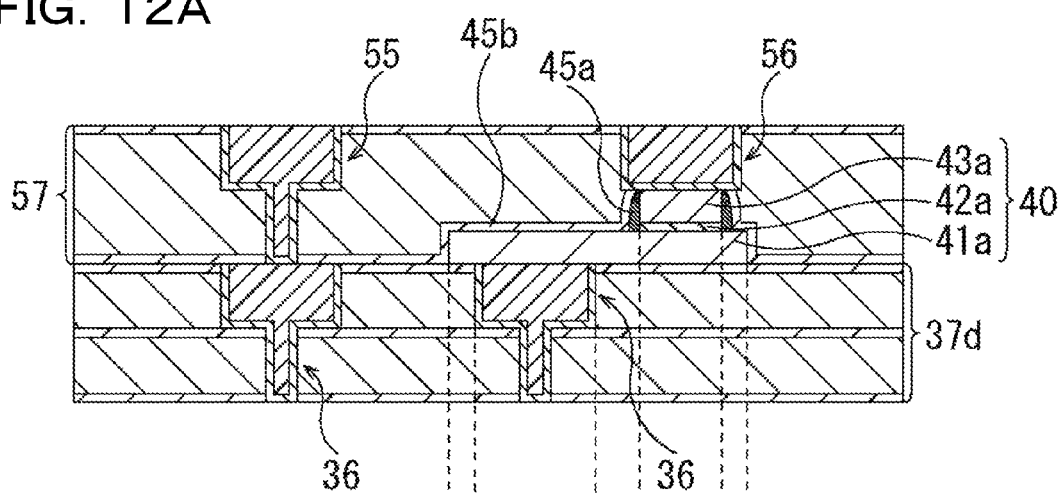
FIGS. 12A and 12B illustrate an exemplary MRAM.
Figure 12B:
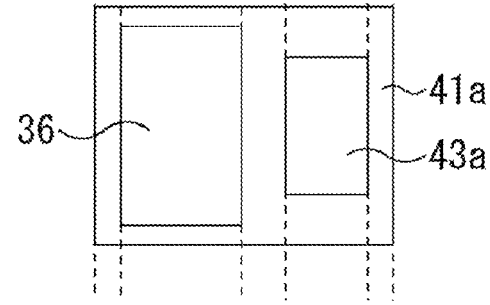

FIGS. 12A and 12B illustrate an exemplary MRAM. As illustrated in FIG. 12A, the wiring structure 36 of the wiring layer 37d, which is coupled to the lower surface of the lower electrode 41a, and the MTJ 42a and the upper electrode 43a of the MTJ element 40, which are coupled to the upper surface of the lower electrode 41a, may be formed not to overlap in a plan view. The upper portion of the wiring structure 36 may not be planarized on the lower electrode 41a. When the MTJ 42a and the upper electrode 43a are formed on the lower electrode 41a, the element performance of the MTJ element 40 may be decreased. Accordingly, the MTJ 42a and the upper electrode 43a may be formed on the planarized portion on the lower electrode 41a so as not to overlap the wiring structures 36 in a plan view. As a result, the MTJ element 40 may have high performance.

As illustrated in FIG. 12B, the wiring structure 36 and the MTJ 42a/the upper electrode 43a, which are respectively coupled to the lower surface and the upper surface of the lower electrode 41a, may be formed to be parallel to each other in the longitudinal direction. In such a case, the MTJ 42a and the upper electrode 43a are formed on the planarized lower electrode 41a so as not to overlap the wiring structure 36 in a plan view. The area of the lower electrode 41a may be reduced.

Damage to the MTJ element 40 when the MRAM having the MTJ element 40 is manufactured may be reduced. Since ashing is not performed when the lower electrode film 41a is patterned, oxidation of the wiring structure 36 lying under the lower electrode film 41a, which includes the conductive member, may not occur. As a result, an MRAM having high reliability may be provided.

Figure 13A:
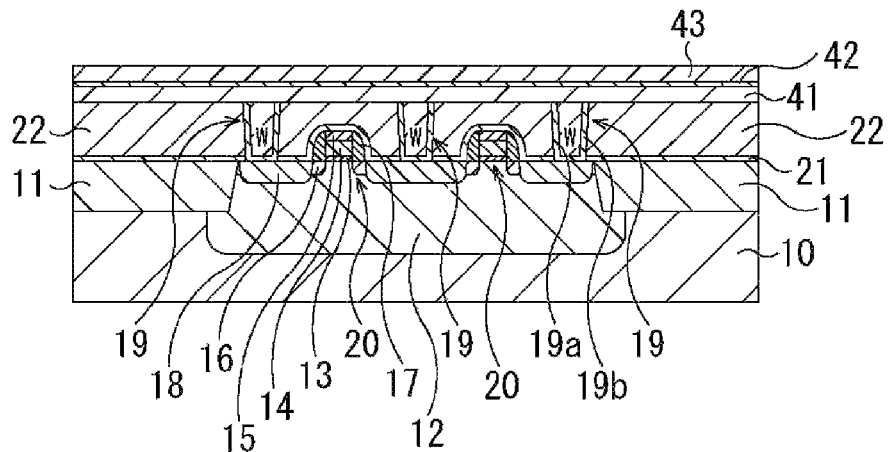
FIGS. 13A to 13C illustrate an exemplary method of manufacturing an MRAM.

FIGS. 13A to 13C, 14A to 14C, 15A to 15C, 16A to 16C, 17A to 17C, 18A to 18C, and 19 illustrate an exemplary a method of manufacturing an MRAM. In these figures, substantially the same elements as those of FIGS. 1A to 1C, 2A to 2C, 3A to 3D, 4A to 4D, 5A to 5D, 6A to 6D, 7A to 7C, 8A to 8C, 9, 10, 11A to 11C, 12A, and 12B are given the same reference numerals, and descriptions thereof may be omitted or reduced. As illustrated in FIG. 13A, a lower electrode film 41, an MTJ film 42, and an upper electrode film 43 are formed as in FIG. 4A.

Figure 13B:
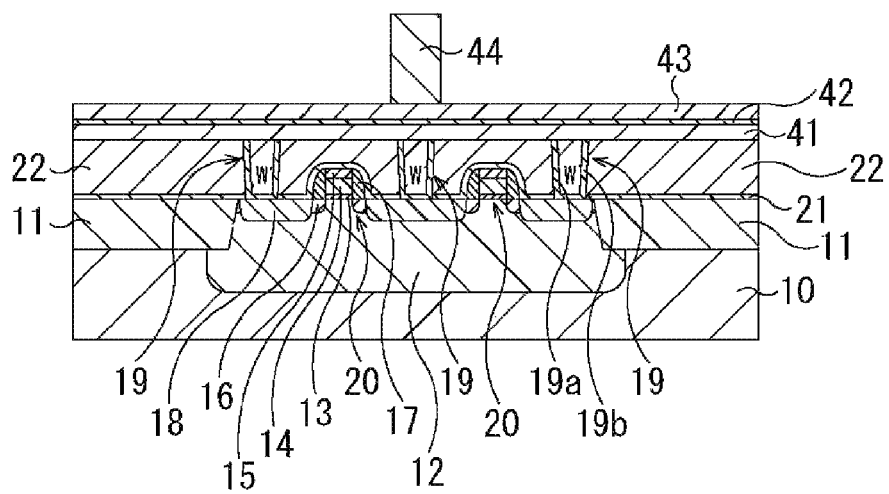
Figure 13C:
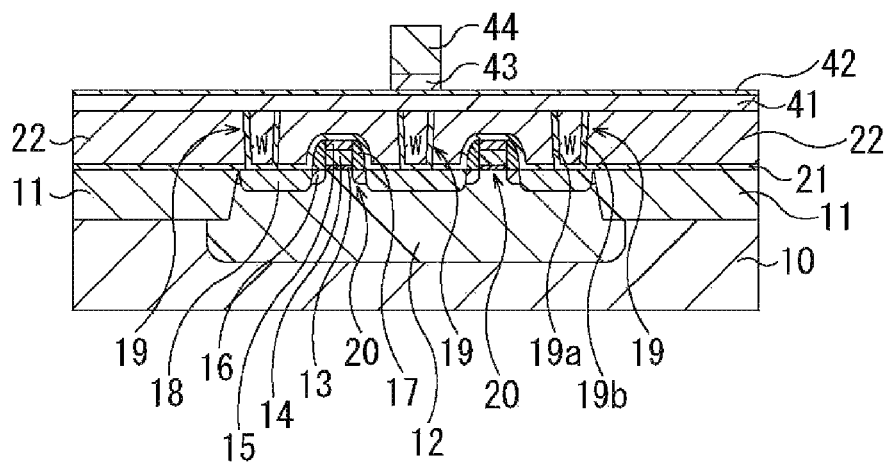

As illustrated in FIG. 13B, a resist pattern 44 is formed on the upper electrode film 43 as in FIG. 4B. As illustrated in FIG. 13C, the upper electrode film 43 is etched as in FIG. 4C.

Figure 14A:
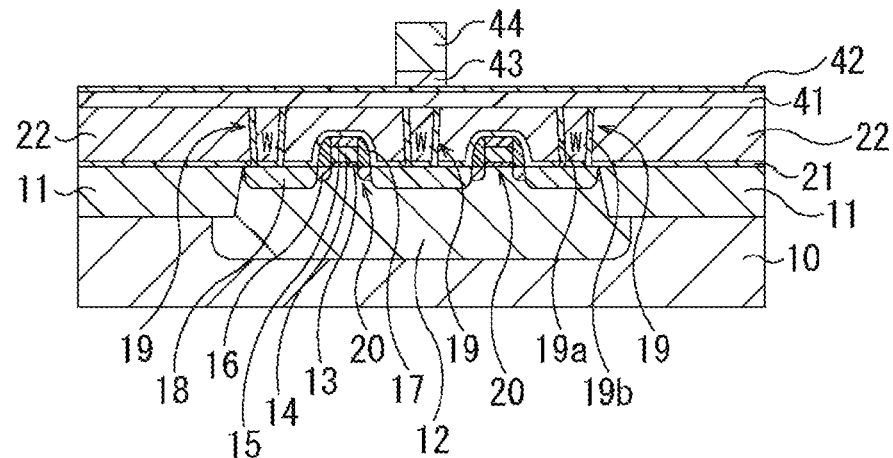
FIGS. 14A to 14C illustrate an exemplary method of manufacturing an MRAM.

As illustrated in FIG. 14A, the resist pattern 44 is removed as in FIG. 4D. Since the ashing is performed in the state where the MTJ film 42 is covered by the Ru film contained in the upper electrode film 43, oxidation of the MTJ film 42 may be reduced.

Figure 14B:
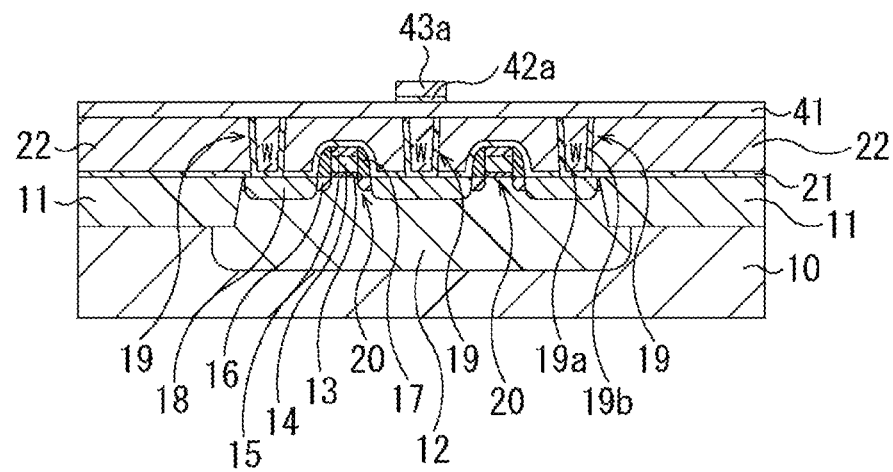

As illustrated in FIG. 14B, the Ru film and the MTJ film 42 exposed in the outside of the region where the upper electrode film 43 is formed are etched as in FIG. 5A. Since the Ru film and the MTJ film 42 are dry-etched without using a mask, ashing is not performed after the etching. Therefore, oxidation due to ashing of the side surface of the MTJ 42a may not occur.

Figure 14C:
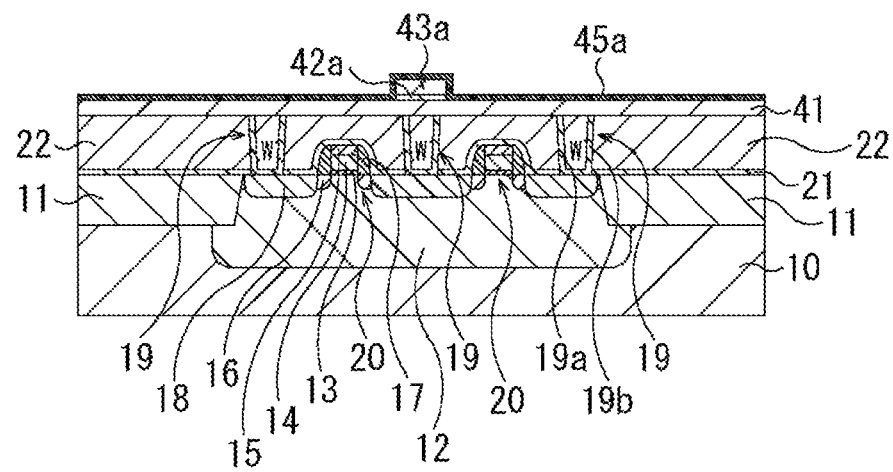
Figure 15A:
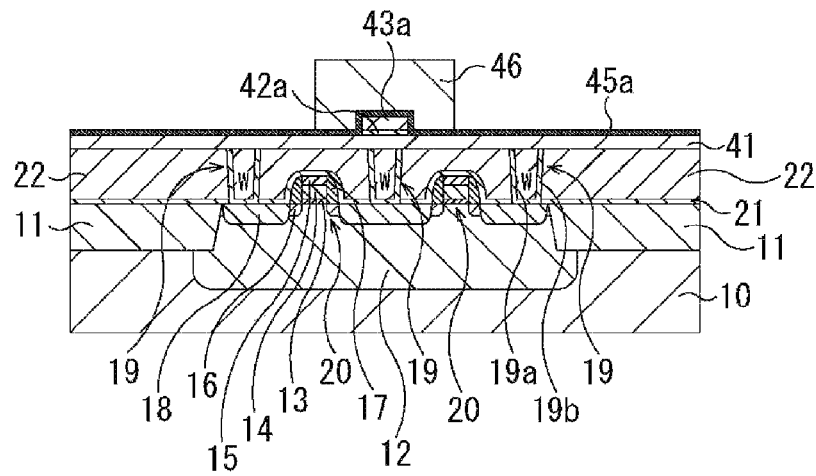
FIGS. 15A to 15C illustrate an exemplary method of manufacturing an MRAM.
Figure 15B:
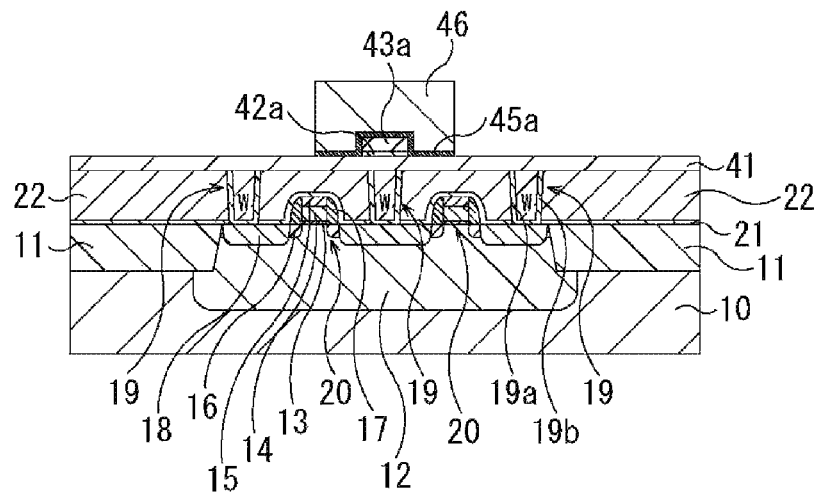

As illustrated in FIG. 14C, a protective film 45a is formed as in FIG. 5B. As illustrated in FIG. 15A, a resist pattern 46 is formed as in FIG. 5C. As illustrated in FIG. 15B, the protective film 45a is etched as in FIG. 5D.

Figure 15C:
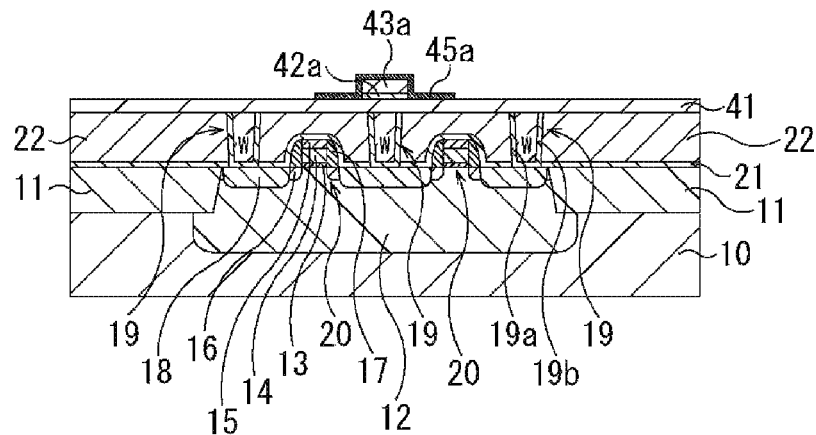

As illustrated in FIG. 15C, the resist pattern 46 is removed as in FIG. 6A. Since the ashing is performed in the state where the side surface of the MTJ 42a is covered by the protective film 45a, oxidation due to ashing of the side surface of the MTJ film 42 may be reduced. Since the ashing is performed in the state where the surface of the conductive plug 19 formed in the interlayer insulating film 22 is covered by the lower electrode film 43, oxidation of the surface of the conductive plug 19 may be reduced.

Figure 16A:
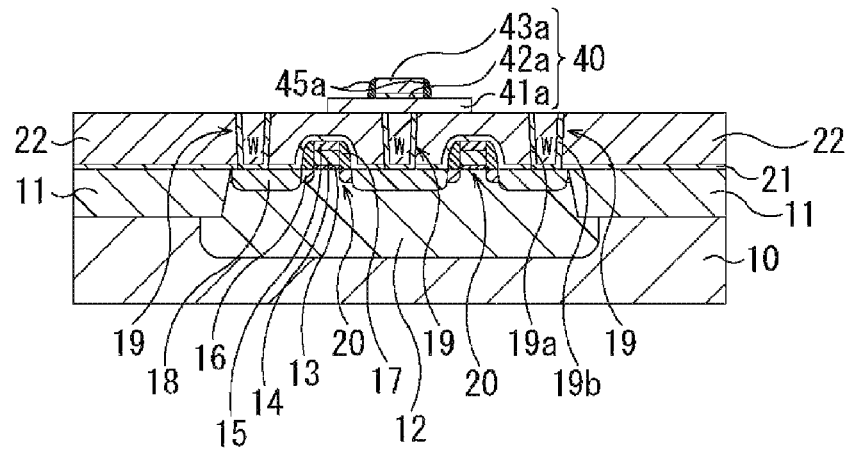
FIGS. 16A to 16C illustrate an exemplary method of manufacturing an MRAM.

As illustrated in FIG. 16A, the lower electrode film 41 is etched as in FIG. 6B. Since the lower electrode film 41 is etched without using a resist mask, ashing of a resist is not performed after the etching. Therefore, oxidation due to ashing of the surface of the conductive plug 19 formed in the interlayer insulating film 22 may not occur.

Figure 16B:
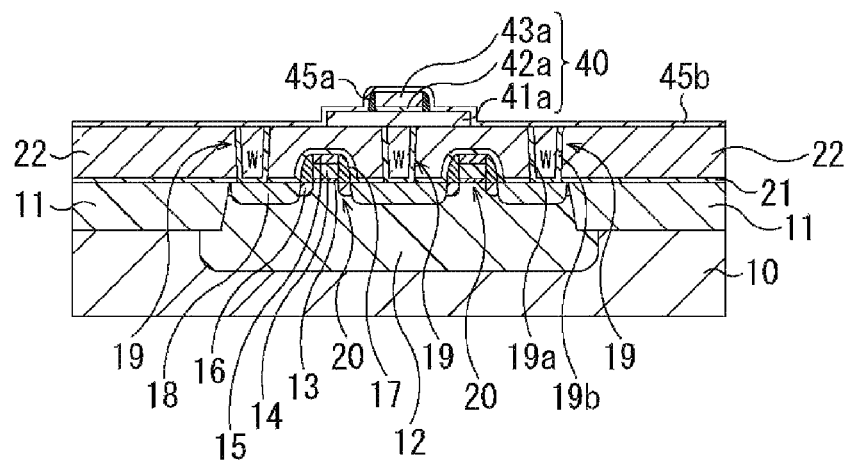

As illustrated in FIG. 16B, a protective film 45b is formed as in FIG. 6C. The side surfaces of the MTJ 42a and the upper electrode 43a are covered by the stacked protective films 45a and 45b having a total thickness of about 60 nm. The MTJ 42a and the upper electrode 43a may be covered by the protective film 45b at regions other than the side surfaces. Since the side surface of the MTJ 42a is covered by the protective films 45a and 45b, process damage to the MTJ 42a may be reduced. The regions other than the side surfaces such as the upper surface of the upper electrode 43a covered by the protective film 45b may be exposed by subsequent etching.

Figure 16C:
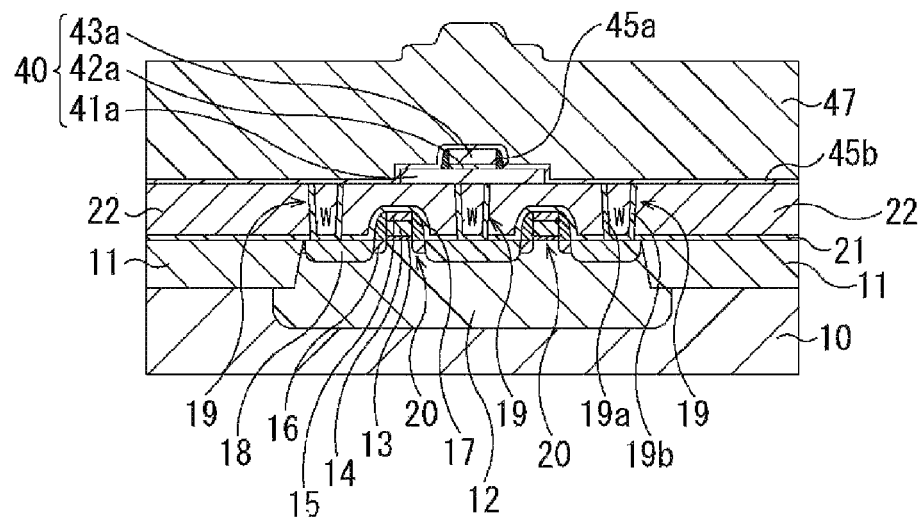
Figure 17A:
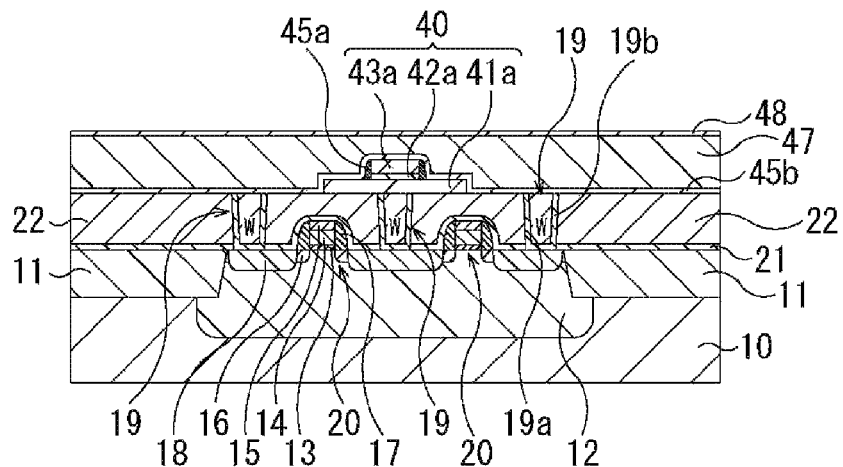
FIGS. 17A to 17C illustrate an exemplary method of manufacturing an MRAM.

As illustrated in FIG. 16C, an interlayer insulating film 47 is formed as in FIG. 6D. As illustrated in FIG. 17A, the surface of the interlayer insulating film 47 is planarized, and the diffusion-preventing film 48 is formed thereon, as in FIG. 7A.

Figure 17B:
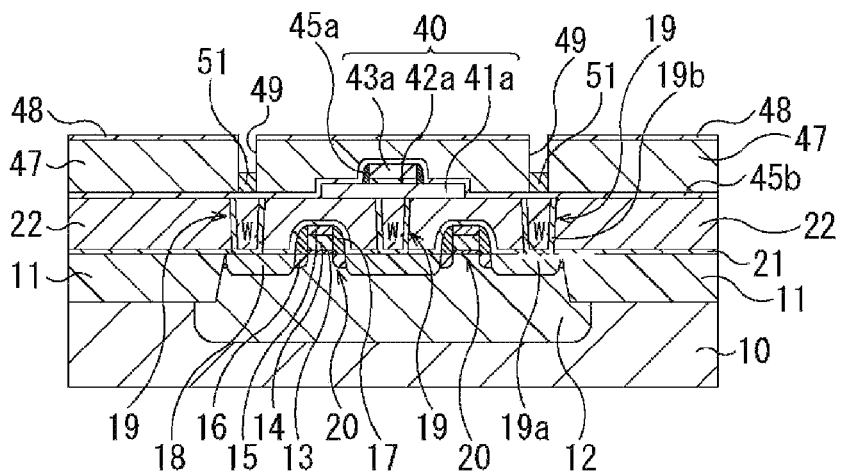

As illustrated in FIG. 17B, the diffusion-preventing film 48 and the interlayer insulating film 47 are patterned by lithography and dry etching, as in FIG. 7B, to form via-holes 49 above the conductive plugs not being provided with the lower electrode 41a on the upper portion. A resin material layer 51 is formed on the diffusion-preventing film 48 so as to plug the via-holes 49. The resin material layer 51 may be dry-etched so that the resin material layer 51 with a certain thickness remains in each via-hole 49.

Figure 17C:
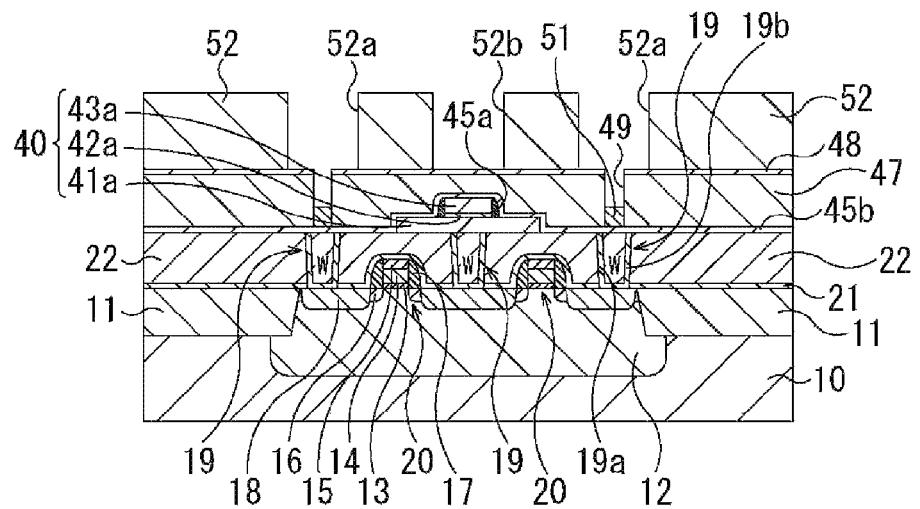
Figure 18A:
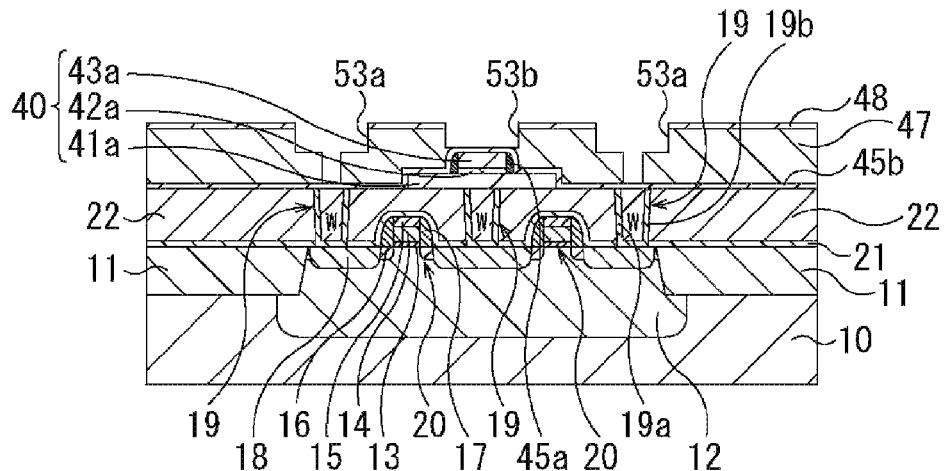
FIGS. 18A to 18C illustrate an exemplary method of manufacturing an MRAM.

As illustrated in FIG. 17C, a resist pattern 52 is formed on the diffusion-preventing film 48 as in FIG. 7C. As illustrated in FIG. 18A, the diffusion-preventing film 48 and the interlayer insulating film 47 are dry-etched using the resist pattern 52 as a mask as in FIG. 8A. The dry etching may be performed till the surface of the protective film 45b is partially exposed using the protective film 45b on the upper electrode 43a as an etching stopper. The wiring gutters 53a communicating with the via-holes 49 and the wiring gutter 53b having the bottom surface where the surface of the protective film 45b on the upper electrode 43a is partially exposed may be substantially contemporaneously formed. The resist pattern 52 and the resin material layer 51 remaining in the via-hole 49 are removed by ashing. Since the resist pattern 52 and the resin material layer 51 are ashed in the state where the upper surface of the upper electrode 43a is covered by the protective film 45b, oxidation due to ashing of the upper electrode 43a may be reduced.

Figure 18B:
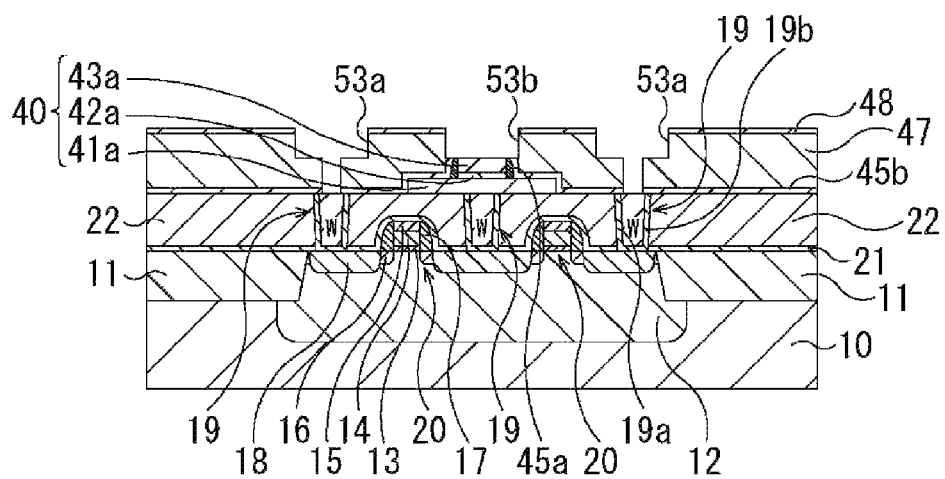

As illustrated in FIG. 18B, the protective film 45b exposed at the bottom surface of the via-hole 49 and the protective film 45b exposed at the bottom surface of the wiring gutter 53b are dry-etched using the diffusion-preventing film 48 as a mask as in FIG. 8B. The surface of the conductive plug 19 is partially exposed at the bottom surface of the via-hole 49, and the surface of the upper electrode 43a is partially exposed at the bottom surface of the wiring gutter 53b. Since the protective film 45b is etched without using a resist mask, ashing of a resist after the etching may not be conducted. Therefore, oxidation due to ashing may not occur in the upper electrode 43a. Since the upper electrode 43a is covered by the protective film 45b, the upper electrode 43a is etched using the diffusion-preventing film 48 as a mask.

Figure 18C:
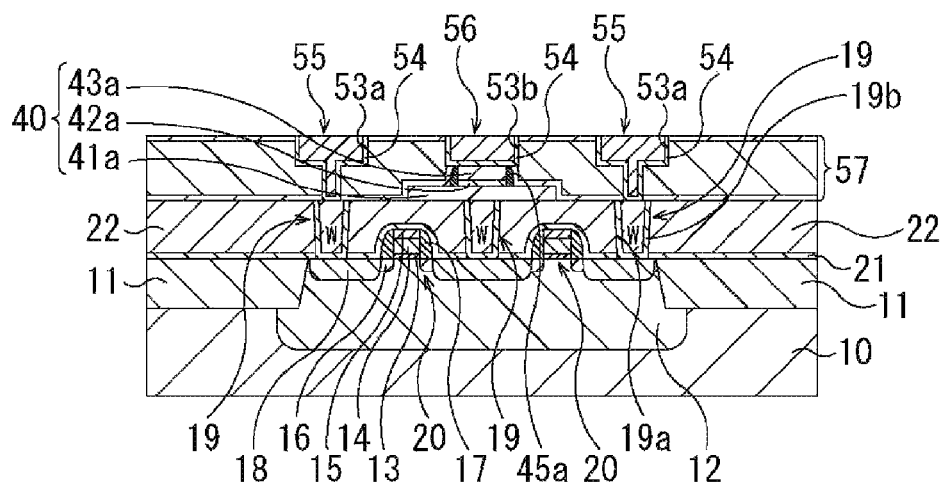

As illustrated in FIG. 18C, a glue film 54 is formed so as to cover the inner surfaces of the unified via-hole 49 and the wiring gutter 53a and the inner surface of the wiring gutter 53b, as in FIG. 8C. A plating seed layer (not shown) is formed on the glue film 54, and the via-holes 49 and the wiring gutters 53a and the wiring gutter 53b are plugged with Cu or a Cu alloy material by plating through the glue film 54. The Cu or the Cu alloy material on the diffusion-preventing film 48 and the glue film 54 are polished and planarized by CMP using the surface of the diffusion-preventing film 48 as a polishing stopper. The via-hole 49 and the wiring gutter 53a are filled with Cu or the Cu alloy material through the glue films 54 to form a wiring structure 55 being electrically coupled to the conductive plug 19. The wiring gutter 53b is filled with Cu or the Cu alloy material through the glue film 54 to form a wiring 56 being electrically coupled to the upper electrode 43a. The wiring structures 55 and the wiring 56 may be substantially contemporaneously formed. The protective films 45a and 45b, the interlayer insulating film 47, and the diffusion-preventing film 48 form an insulating layer. The wiring layer 57 may include the insulating layer and a structure having the MTJ element 40 formed in the insulating layer, the wiring structures 55 and the wiring 56.

Figure 19:
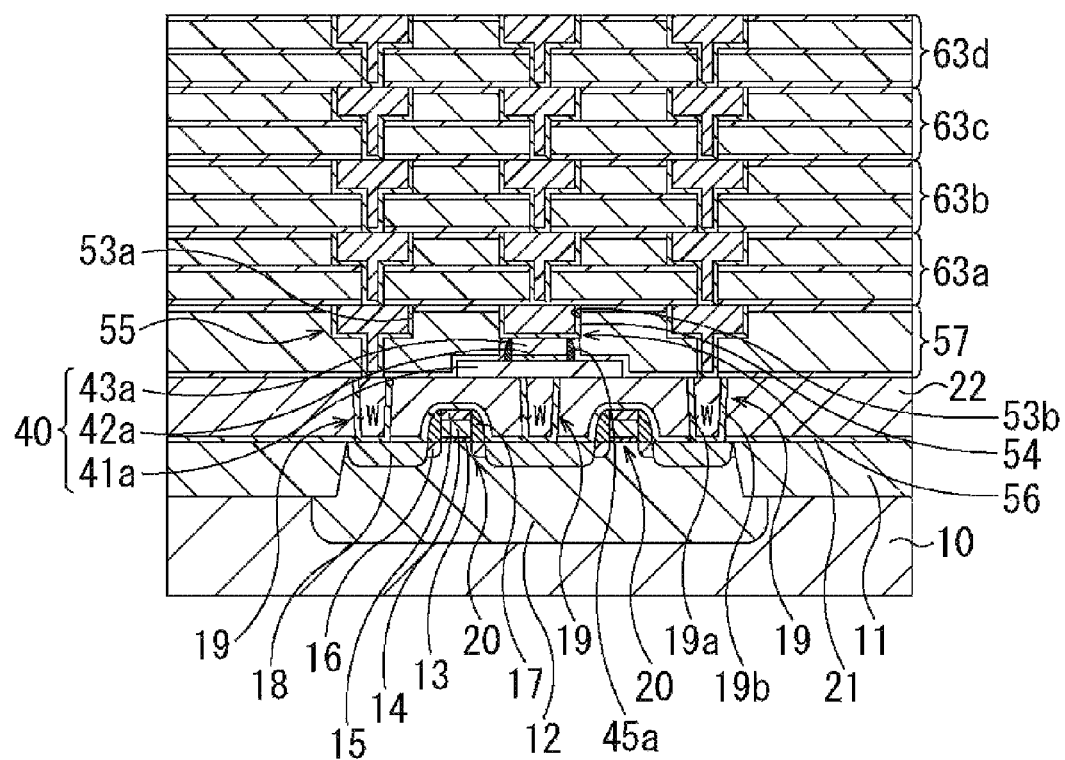
FIG. 19 illustrates an exemplary method of manufacturing an MRAM.

As illustrated in FIG. 19, a dual-damascene process substantially the same as or similar to that illustrated in FIGS. 2C and 3A to 3C is repeated a plurality of times, for example, four times. The wiring layers 63a to 63d each having a structure that is substantially the same as or similar to that of the wiring layer 37a where the wiring structures 55 and the wiring 56 are electrically coupled to each other may be sequentially formed on the wiring layer 57.

An upper wiring layer, a protective film, and a pad electrode are formed, and then an MRAM is formed.

Damage to the MTJ element 40 when the MRAM having the MTJ element 40 is manufactured may be reduced. Since ashing is not performed in the patterning of the lower electrode film 41, the conductive member of the layer lying under the lower electrode film 41, for example, the conductive plug 19 including W, may not be oxidized. Therefore, an MRAM having high reliability may be provided.

Example embodiments of the present invention have now been described in accordance with the above advantages. It will be appreciated that these examples are merely illustrative of the invention. Many variations and modifications will be apparent to those skilled in the art.

The invention claimed is:

1. A method of manufacturing a semiconductor device, the method comprising:
    forming a first conductive layer on a semiconductor substrate;
    forming a magnetic film on the first conductive layer;
    forming a second conductive layer on the magnetic film;
    forming a first mask layer on the second conductive layer;
    patterning the second conductive layer using the first mask layer to form a patterned second conductive layer;
    patterning the magnetic film using the patterned second conductive layer to form a patterned magnetic film;
    forming a first insulating film on the first conductive layer to cover a side surface of the patterned second conductive layer and the patterned magnetic film;
    forming a second mask layer on the first insulating film to cover the patterned second conductive layer, the patterned magnetic film, and the first insulating film;
    patterning the first insulating film using the second mask layer to form a patterned first insulating film;
    patterning the first conductive layer using the patterned first insulating film to form a patterned first conductive film;
    forming a second insulating film on the semiconductor substrate to cover the patterned second conductive layer, the patterned magnetic film, and the patterned first conductive layer; and
    forming a third insulating film on the second insulating film.

2. The method according to claim 1 further comprising:
    removing the second mask layer after patterning the first insulating film and before patterning the first conductive layer.

3. The method according to claim 2 further comprising:
    removing the first mask layer after patterning the second conductive layer and before patterning the magnetic film.

4. The method according to claim 1, wherein
    the first insulating film includes at least one selected from a group of consisting of SiC, SiN, SiCN, and carbon.

5. The method according to claim 1, wherein
    the second insulating film includes at least one selected from a group of consisting of SiC, SiN, SiCN, and carbon.

6. The method according to claim 1, wherein
    the first insulating film after the patterning of the first conductive layer and before forming the second insulating film is located on the side surface of the patterned second conductive layer and the patterned magnetic film.

7. The method according to claim 1 further comprising:
    forming a plurality of wirings on the semiconductor substrate; forming the first conductive layer to cover the plurality of wirings;
    exposing a second wiring, among the plurality of wirings, other than a first wiring lying under the patterned first conductive layer; and
    forming the second insulating film to cover the second wiring.

8. The method according to claim 7, wherein
    the patterned second conductive layer and the first wiring lying under the patterned first conductive layer are not superimposed on each other in plan view.

9. The method according to claim 8, wherein
    the patterned second conductive layer and the first wiring lying under the patterned first conductive layer are arranged in parallel to each other.

10. The method according to claim 1 further comprising:
    forming a third mask layer on the third insulating film;
    forming a first gutter by patterning the third insulating film using the third mask layer to expose the second insulating film covering the second conductive layer;
    ashing the third mask layer in a state where the patterned second conductive layer is covered by the second insulating film; and
    exposing the second conductive layer at the bottom of the first gutter by patterning the second insulating film using the patterned third insulating film.

11. The method according to claim 10, wherein
    the third masking layer includes a resist.

12. The method according to claim 10 further comprising:
    forming an opening through the third insulating film before forming the third mask layer to be aligned to the patterned first conductive layer; and
    forming a second gutter in the third insulating film to communicate with the opening.

13. The method according to claim 12, wherein
    the first gutter has a wiring shape; and
    the first gutter and the second gutter are substantially contemporaneously formed.

14. The method according to claim 1 further comprising:
    forming a third mask layer on the third insulating film;
    forming an opening through the third insulating film to expose the second insulating film using the third mask layer;
    removing the third mask layer in a state where the patterned second conductive layer is covered by the second insulating film; and
    exposing the second conductive layer at the bottom of the opening by patterning the second insulating film using the patterned third insulating film.

* * * * *